(12) United States Patent
Mochizuki

(10) Patent No.: US 7,483,469 B2
(45) Date of Patent: Jan. 27, 2009

(54) SURFACE-EMITTING TYPE SEMICONDUCTOR LASER AND ITS MANUFACTURING METHOD, OPTICAL MODULE, AND LIGHT TRANSMISSION DEVICE

(75) Inventor: Masamitsu Mochizuki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 190 days.

(21) Appl. No.: 11/259,189

(22) Filed: Oct. 27, 2005

(65) Prior Publication Data

US 2006/0093008 A1 May 4, 2006

(30) Foreign Application Priority Data

Nov. 1, 2004 (JP) ............................. 2004-317777
Jun. 7, 2005 (JP) ............................. 2005-167118

(51) Int. Cl.
*H01S 5/00* (2006.01)
*H01S 3/08* (2006.01)
(52) U.S. Cl. ............................. 372/50.124; 372/50.23; 372/92; 372/98; 372/101
(58) Field of Classification Search ............ 372/50.124, 372/50.23, 101
See application file for complete search history.

(56) References Cited

U.S. PATENT DOCUMENTS

| 5,838,715 | A | * | 11/1998 | Corzine et al. | ................. | 372/96 |
| 6,026,111 | A | * | 2/2000 | Jiang et al. | ..................... | 372/96 |
| 6,597,720 | B2 | | 7/2003 | Kondo | | |
| 6,653,157 | B2 | | 11/2003 | Kondo | | |
| 6,990,134 | B2 | * | 1/2006 | Park et al. | ................. | 372/50.11 |
| 7,294,863 | B2 | * | 11/2007 | Lee et al. | ....................... | 257/98 |
| 2002/0044582 | A1 | * | 4/2002 | Kondo | ........................ | 372/46 |

2002/0176468 A1 11/2002 Kaneko (Continued)

FOREIGN PATENT DOCUMENTS

JP 2000-067449 A 3/2000

(Continued)

OTHER PUBLICATIONS

M. Notomi et al., "Lasing Action Due to the Two-Dimensional Quasiperiodicity of Photonic Quasicrystals With a Penrose Lattice," Mar. 26, 2004, pp. 1-4, vol. 92, No. 12, Phys. Rev. Lett.

*Primary Examiner*—Minsun Harvey
*Assistant Examiner*—Phillip Nguyen
(74) *Attorney, Agent, or Firm*—Oliff & Berridge, PLC

(57) ABSTRACT

To provide surface-emitting type semiconductor lasers that can emit laser light with a high power output and a narrow radiation angle, and methods for manufacturing the same. A surface-emitting type semiconductor laser 200 in accordance with the present invention includes a substrate 101, a first mirror 102 formed above the substrate 101, an active layer 103 formed above the first mirror 102, a second mirror 104 formed above the active layer 103, and a lens section 190 formed above the second mirror 104, wherein the lens section 190 has a function to change a path of light that is emitted from an upper surface 104*a* of the second mirror 104, at least one of the first mirror 102 and the active layer 103 has a photonic crystal region 122 having a refractive index distribution that is periodic in a plane direction, and the photonic crystal region 122 has a defect region 124 and has a function to confine light in the defect region 124.

13 Claims, 14 Drawing Sheets

U.S. PATENT DOCUMENTS

| | | | |
|---|---|---|---|
| 2003/0197184 A1* | 10/2003 | Kaneko | 257/79 |
| 2004/0004984 A1* | 1/2004 | Kim et al. | 372/45 |
| 2004/0091010 A1* | 5/2004 | Choquette et al. | 372/44 |
| 2004/0114654 A1 | 6/2004 | Kaneko | |
| 2004/0120379 A1 | 6/2004 | Kaneko et al. | |
| 2005/0047718 A1 | 3/2005 | Kaneko | |
| 2005/0056772 A1 | 3/2005 | Kaneko | |

FOREIGN PATENT DOCUMENTS

| | | |
|---|---|---|
| JP | 2001-284725 A | 10/2001 |
| JP | 2002-100758 A | 4/2002 |
| JP | 2002-353564 A | 12/2002 |
| JP | 2003-258380 A | 9/2003 |
| JP | 2004-109737 A | 4/2004 |
| JP | 2004-119581 A | 4/2004 |
| JP | 2004-119582 A | 4/2004 |
| JP | 2005-045049 A | 2/2005 |
| JP | 2005-056988 A | 3/2005 |

* cited by examiner

SURFACE-EMITTING TYPE SEMICONDUCTOR LASER AND ITS MANUFACTURING METHOD, OPTICAL MODULE, AND LIGHT TRANSMISSION DEVICE

This application claims the benefit of Japanese Patent Applications No. 2004-317777, filed Nov. 1, 2004 and No. 2005-167118, filed Jun. 7, 2005. The entire disclosure of the prior applications are hereby incorporated by reference herein in its entirety.

BACKGROUND

The present invention relates to surface-emitting type semiconductor lasers and methods for manufacturing the same, optical modules, and light transmission devices.

Surface-emitting type semiconductor lasers are attracting attention in the field of optical communications as low cost and high performance light sources. When surface-emitting type semiconductor lasers are used for optical communications, there are cases where it may be desirous to obtain a laser beam with a radiation pattern having a narrow radiation angle.

For example, Japanese Laid-open Patent Application 2000-67449 proposes a method for forming a micro lens by an ink jet method on a laser beam emission surface of a single crystal silicon layer to thereby narrow the radiation angle. In this case, because the transverse mode is defined by an oxidized constricting layer, the number of optical modes would increase if a large current is to be injected by expanding the constricting aperture.

[Patent Document 1] Japanese Laid-open Patent Application 2000-67449

SUMMARY

It is an object of the present invention to provide surface-emitting type semiconductor lasers that provide a high power output and are capable of emitting a laser beam with a narrow radiation angle, and methods for manufacturing the same. Also, it is an object of the present invention to provide optical modules and light transmission devices which include the surface-emitting type semiconductor lasers.

A surface-emitting type semiconductor laser in accordance with the present invention includes:

a substrate;

a first mirror formed above the substrate;

a lens section formed above the second mirror, wherein the lens section has a function to change a path of light that is emitted from an upper surface of the second mirror, at least one of the first mirror and the active layer has a photonic crystal region having a refractive index distribution that is periodic in a plane direction, and the photonic crystal region has a defect region and has a function to confine light in the defect region.

According to the surface-emitting type semiconductor laser, a laser beam can be oscillated with a low threshold current, and a laser beam with a high power output can be obtained. Moreover, the radiation angle can be narrowed.

It is noted that, in the present invention, a specific object (hereafter referred to as "B") formed above another specific object (hereafter referred to as "A") includes B directly formed on A, and B formed above A through another object on A. Also, in the present invention, forming B above A includes a case of forming B directly on A, and a case of forming B above A through another object on A.

Also, in the present invention, the term "periodic" refers to a concept including "psuedoperiodic." In other words, the photonic crystal region in accordance with the present invention includes a region having a periodic photonic crystal structure and a region having a psuedoperiodic photonic crystal structure. As the psuedoperiodic photonic crystal structure, for example, a photonic quasicrystal structure (for example, see M. Notomi, H. Suzuki, T. Tamamura, and K. Edagawa, Phys. Rev. Lett. 92 (2004) 123906.) or a circle coordinate photonic crystal structure (for example, see Japanese Laid-open Patent Application 2004-109737) can be enumerated.

In the surface-emitting type semiconductor laser in accordance with the present invention, the second mirror may have the photonic crystal region.

In the surface-emitting type semiconductor laser in accordance with the present invention, a plurality of holes extending in a thickness direction may be formed in the photonic crystal region other than the defect region.

In the surface-emitting type semiconductor laser in accordance with the present invention, a center of the defect region in a plan view concurs or generally concurs with a center of light emitted from the upper surface of the second mirror, and the plurality of holes may be arranged at positions rotationally symmetric with respect to the center of the defect region.

In the surface-emitting type semiconductor laser in accordance with the present invention, the holes may be filled with a dielectric material.

In the surface-emitting type semiconductor laser in accordance with the present invention, the lens section may be formed at least above the defect region.

The surface-emitting type semiconductor laser in accordance with the present invention may include an electrode formed above the second mirror, wherein the lens section formed may be dammed out by the electrode.

An optical module in accordance with the present invention includes the surface-emitting type semiconductor laser described above and an optical waveguide.

A light transmission device in accordance with the present invention includes the optical module described above.

A method for manufacturing a first surface-emitting type semiconductor laser in accordance with the present invention includes:

a step of laminating, above a substrate, semiconductor layers for composing at least a part of a first mirror;

a step of forming a photonic crystal region having a refractive index distribution that is periodic in a plane direction within at least one of the first mirror and an active layer;

a step of forming a sacrificial layer above another substrate;

a step of laminating, above the sacrificial layer, other semiconductor layers for composing at least a part of a second mirror;

a step of laminating a side of the substrate where the at least a part of the first mirror is formed and a side of the other substrate where the at least a part of the second mirror is formed;

a step of removing the sacrificial layer to separate the other substrate;

a step of patterning the semiconductor layers and the other semiconductor layers to form a columnar section including at least a part of the second mirror; and a step of forming a lens section above the columnar section, wherein the active layer is laminated in at least one of the step of laminating the semiconductor layers and the step of laminating the other semiconductor layers, the lens section is formed to have a function to change a path of light emitted from an upper surface of the second mirror, and formed by a droplet discharge method that discharges droplets including a material of the lens section, and the photonic crystal region is formed to have a defect region, and is formed to have a function to confine light in the defect region.

In the method for manufacturing a surface-emitting type semiconductor laser in accordance with the present invention, a plurality of holes extending in a thickness direction may be formed in the photonic crystal region other than the defect region.

A method for manufacturing a second surface-emitting type semiconductor laser in accordance with the present invention includes:

a step of laminating, above a substrate, semiconductor layers for composing at least a part of a first mirror;

a step of forming a photonic crystal region having a refractive index distribution that is periodic in a plane direction within at least one of the first mirror and an active layer;

a step of forming a dielectric member above the semiconductor layers;

a step of removing the dielectric member from an upper surface side thereof until an upper surface of the semiconductor layers is exposed;

a step of laminating, above the semiconductor layers and the dielectric member, other semiconductor layers for composing at least a part of a second mirror;

a step of patterning the semiconductor layers and the other semiconductor layers to form a columnar section including at least a part of the second mirror; and a step of forming a lens section above the columnar section, wherein the active layer is laminated in at least one of the step of laminating the semiconductor layers and the step of laminating the other semiconductor layers, the lens section is formed to have a function to change a path of light emitted from an upper surface of the second mirror, and formed by a droplet discharge method that discharges droplets including a material of the lens section, the photonic crystal region is formed to have a defect region, and is formed to have a function to confine light in the defect region, a plurality of holes extending in a thickness direction are formed in the photonic crystal region other than the defect region, and the dielectric member is formed in a manner to embed the holes.

In the method for manufacturing a surface-emitting type semiconductor laser in accordance with the present invention, in the step of forming the photonic crystal region, the photonic crystal region may be formed in the second mirror.

The method for manufacturing a surface-emitting type semiconductor laser in accordance with the present invention includes, before the step of forming the lens section, a step of forming an electrode above the columnar section, wherein, in the step of forming the lens section, the droplets may be dammed out by the electrode.

DETAILED DESCRIPTION OF EMBODIMENTS

Preferred embodiments of the present invention are described below with reference to the accompanying drawings.

1. First Embodiment 1.1. Structure of Surface-Emitting Type Semiconductor Laser

Figure 1:
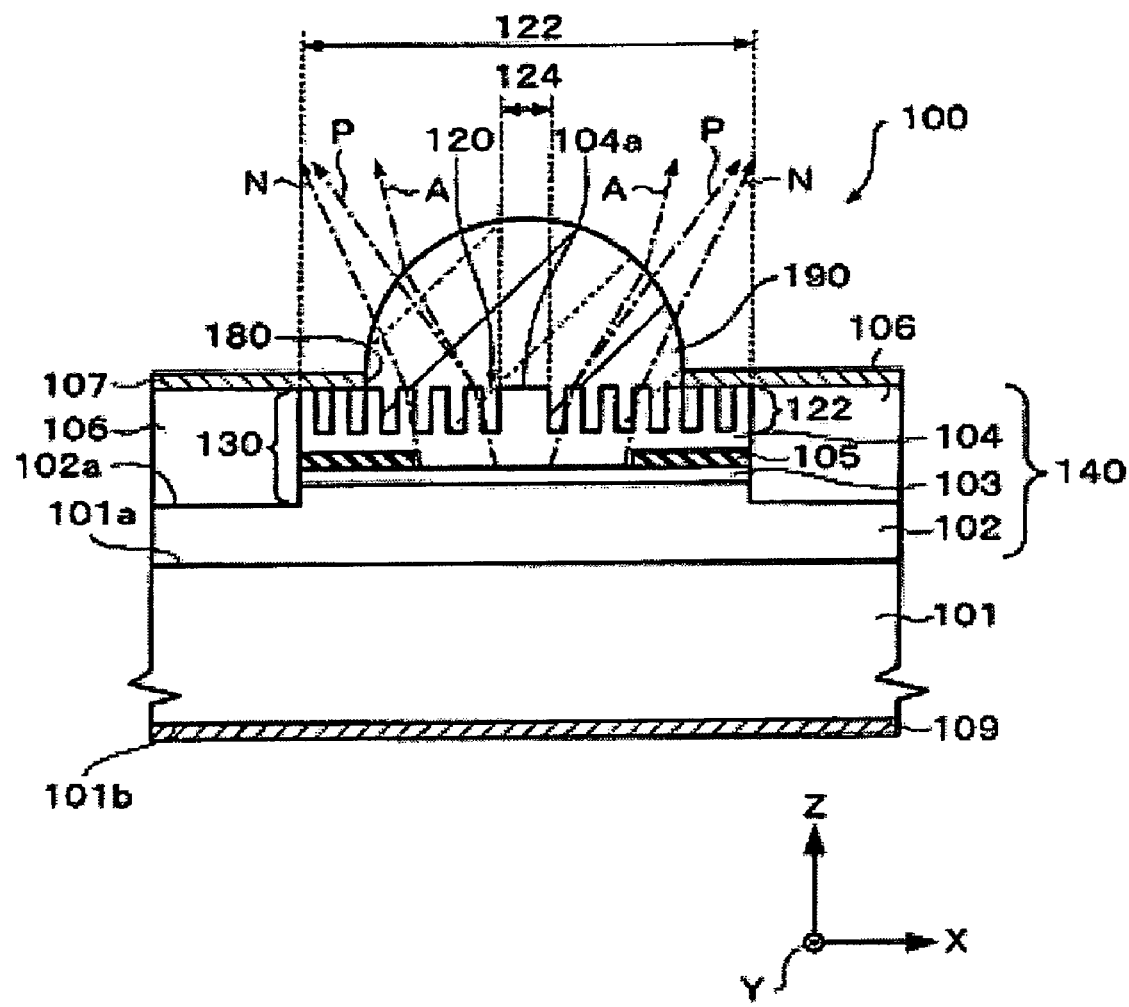
[FIG. 1] is a cross-sectional view schematically showing a surface-emitting laser in accordance with a first embodiment.
Figure 2:
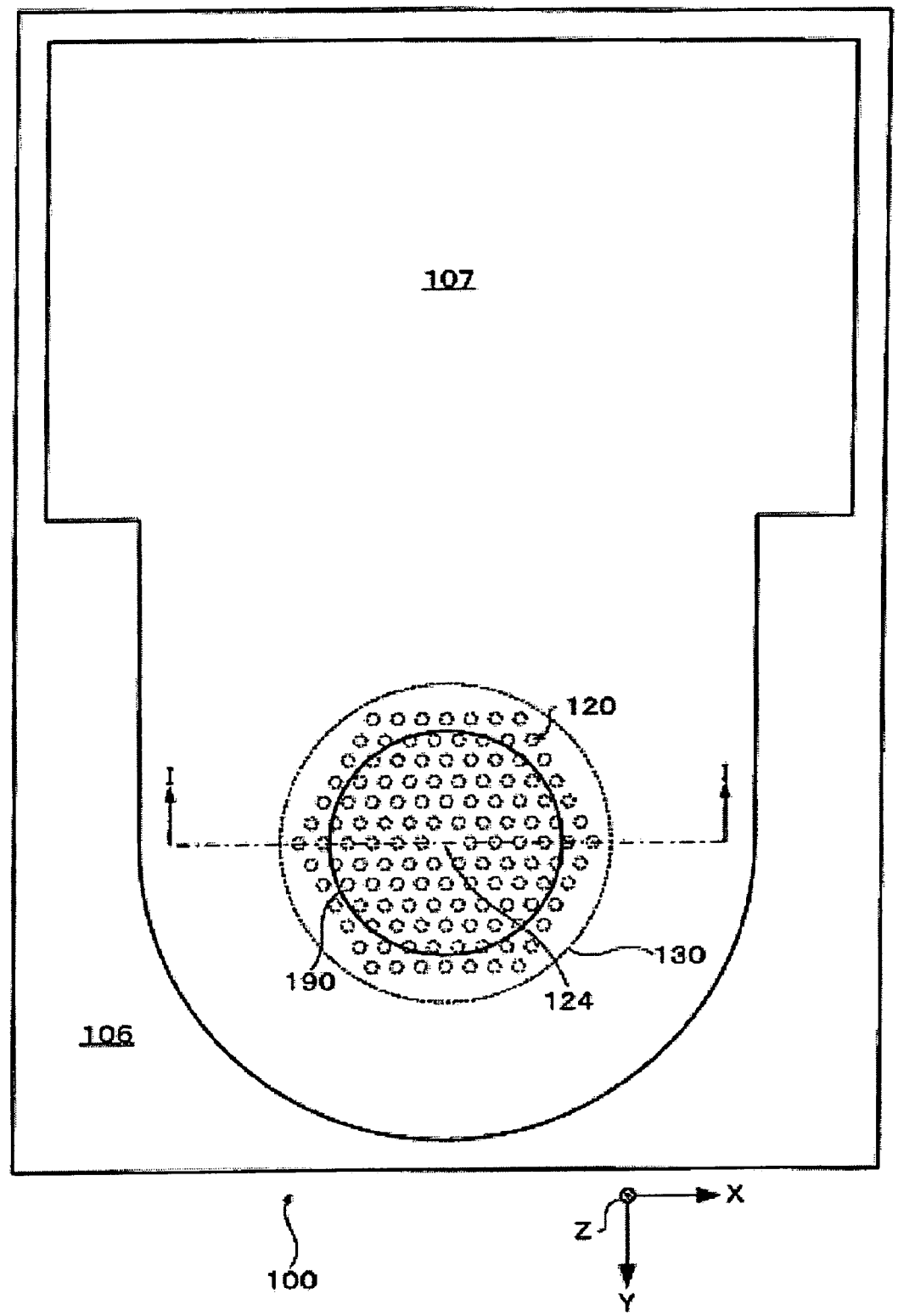
[FIG. 2] is a plan view schematically showing the surface-emitting laser in accordance with the first embodiment.

FIG. 1 schematically shows a cross-sectional view of a surface-emitting type semiconductor laser (hereinafter also referred to as "surface-emitting laser") 100 in accordance with a first embodiment of the present invention. Also, FIG. 2 schematically shows a plan view of the surface-emitting type semiconductor laser 100 shown in FIG. 1. It is noted that FIG. 1 is a view showing a cross section taken along a line I-I of FIG. 2.

The surface-emitting laser 100 of the present embodiment includes, as shown in FIG. 1 and FIG. 2, a substrate (an n-type GaAs substrate that is a semiconductor substrate, in accordance with the present embodiment) 101, a vertical resonator (hereafter referred to as a "resonator") 140 formed on the substrate 101, a first electrode 107, a second electrode 109, and a lens section 190. The resonator 140 includes a first mirror 102, an active layer 103 and a second mirror 104.

Next, constituting elements of the surface-emitting laser 100 are described.

The resonator 140 is formed from, for example, the first mirror 102 that is a distributed Bragg reflection type (DBR) mirror composed of 40 pairs of semiconductor multilayer films of alternately laminated n-type $Al_{0.9}Ga_{0.1}As$ layers and n-type $Al_{0.15}Ga_{0.85}As$ layers, the active layer 103 composed of GaAs well layers and $Al_{0.3}Ga_{0.7}As$ barrier layers in which the well layers include a quantum well structure composed of three layers, and the second mirror 104 that is a DBR mirror composed of semiconductor multilayer films of 25 pairs of alternately laminated p-type $Al_{0.9}Ga_{0.1}As$ layers and p-type $Al_{0.15}Ga_{0.85}As$ layers, which are successively stacked in layers. It is noted that the composition of each of the layers and the number of layers forming the first mirror 102, the active layer 103 and the second mirror 104 are not particularly limited.

A contact layer composed of, for example, GaAs may be provided between the second mirror 104 and the first electrode 107, if necessary.

The second mirror 104 may be formed to be p-type, for example, by doping carbon (C), zinc (Zn) or Magnesium (Mg), and the first mirror 102 may be formed to be n-type, for example, by doping silicon (Si) or Selenium (Se). Accordingly, the p-type second mirror 104, the active layer 103 in which no impurity is doped, and the n-type first mirror 102 form a pin diode.

A portion among the resonator 140 extending from the second mirror 104 to an intermediate point of the first mirror 102 is etched in a circular shape, as viewed toward an upper surface 104a of the second mirror 104, whereby a columnar semiconductor deposited body (hereafter referred to as a "columnar section") 130 is formed. The diameter of the circle that is a plane configuration of the columnar section 130 may be appropriately set, but can be for example about 50 μm. It is noted that, in the present embodiment, the columnar section 130 has a plane configuration that is circular, but can have any arbitrary configuration.

Further, an oxidized constricting layer 105 that is obtained by oxidizing an AlGaAs layer from its side surface is formed in a region near the active layer 103 among the layers composing the second mirror 104. The oxidized constricting layer 105 is formed in a ring shape. In other words, the oxidized constricting layer 105 has a cross-sectional shape, as being cut in a plane parallel with the surface 101a of the substrate 101 shown in FIG. 1, which is a ring shape concentric with the circular shape of the plane configuration of the columnar section 130.

The second mirror 104 has a photonic crystal region 122 having a refractive index distribution that is periodic in a plane direction of the second mirror 104. In the illustrated example, plural holes 120 extending in the thickness direction of the second mirror 104 are formed in the photonic crystal region 122. As shown in FIG. 1 and FIG. 2, the photonic crystal region 122 has a region where the holes 120 are not formed, in other words, a defect region 124. Stated otherwise, in the illustrate example, the holes 120 are arranged in plural at the same pitch intervals in a triangular lattice configuration around the defect region 124. In the illustrate example, the number of the holes 120 is 126, but the number can be optionally increased or decreased. Also, the arrangement of the holes 120 is not limited to a triangular lattice configuration as long as they have certain rotational symmetry and periodicity, and may be in a square lattice configuration. Also, the holes 120 may be formed at positions that have rotational symmetry of order 2 or more with respect to the center of the defect region 124 as viewed in a plan view. For example, the holes 120 arranged in a triangular lattice configuration shown in FIG. 2 have 6-fold rotational symmetry. Also, the depth of the holes 120 is not particularly limited. For example, the holes 120 may be formed in a manner to penetrate the second mirror 104. Also, for example, the holes 120 may be formed in a manner to penetrate the second mirror 104, and further to dig into an intermediate point of the active layer 103, or may be formed in a manner to penetrate the active layer 103. Also, for example, the holes 120 may be formed in a manner to penetrate the active layer 103, and further to dig into an intermediate point of the first mirror 102, or may be formed in a manner to penetrate the first mirror 102.

The center of the defect region 124, as viewed in a plan view, may concur or generally concur with the center of a light beam emitted from the upper surface 104a of the second mirror 104. By the photonic crystal region 122 described above, light can be confined in the defect region 124.

As shown in FIG. 1, the holes 120 in an area where the lens section 190 is formed may be filled with a material of the lens section 190. By this, the range of change in refractive index in the refractive index distribution in the photonic crystal region 122 becomes smaller, compared to the case where the holes 120 are not filled with the material of the lens section 190. Accordingly, in the plane direction of the second mirror 104, the number of modes of light that satisfy the total reflection condition reduces. As a result, the number of modes of laser light emitted from the resonator 140 can be reduced. Then, for example, the laser light emitted from the resonator 140 can be made to have a single mode, while keeping unchanged an area of the defect region 124 in a plan view that would cause multiple modes when the holes 120 are not filled with the material of the lens section 190. By this, because the laser light can be made to have a signal mode, and the injection current density can be made greater, laser light with a higher power output can be retrieved.

Further, compared to the case where the holes 120 are not filled with the material of the lens section 190, the number of modes of light emitted from the resonator 140 can be made difficult to increase even when the area of the defect region 124 in a plan view is increased. When the area of the defect region 124 in a plan view becomes greater, the radiation angle of laser light emitted from the resonator 140 becomes narrower. Accordingly, if the holes 120 are filled with the material of the lens section 190, laser light with a fewer number of modes and a narrower radiation angle can be emitted from the resonator 140.

It is noted that the material for filling the holes 120 is not limited to the material of the lens section 190, but an appropriate material can be selected.

Furthermore, although not illustrated, a portion of the holes 120 in the region where the lens section 190 is formed can be filled with the material of the lens section 190. Alternatively, the holes 120 in the region where the lens section 190 is formed may not be filled with the material of the lens section 190. By this, the range of change in refractive index in the refractive index distribution in the photonic crystal region 122 becomes greater, compared to the case where the holes 120 are filled with the material of the lens section 190. Accordingly, in the plane direction of the second mirror 104, it becomes easier for light to meet the total reflection condition, and the light confining effect can be enhanced. Consequently, oscillation can be caused with a lower threshold value. The degree of penetration of the material of the lens section 190 in the holes 120 can be controlled by, for example, adjusting the viscosity or the like of the material of the lens section 190.

In the surface-emitting laser 100 in accordance with the present embodiment, an embedding dielectric layer 106 is formed to cover the side surface of the columnar section 130. For example, polyimide resin, fluorine resin, acrylic resin, epoxy resin, etc. can be used as the resin that composes the embedding dielectric layer 106. In particular, the resin may preferably be polyimide resin or fluorine resin in view of their easiness of processing and nonconductivity.

A first electrode 107 is formed on the columnar section 130 and the embedding dielectric layer 106. The first electrode 107 has an opening section 180 over the columnar section 130. The plane configuration of the opening section 180 of the first electrode 107 is determined by the function and usage of the lens section 190 that is formed on the upper surface 104a of the second mirror 104. For example, the plane configuration of the opening section 180 of the first electrode 107 can be made circular. By this, the three-dimensional shape of the lens section 190 can be made in a spherical shape or a shape in which a part of a spherical shape is cut (see FIG. 1 and FIG. 2). Also, for example, the plane configuration of the opening section 180 of the first electrode 107 can be made rectangular.

The first electrode 107 is formed from a multilayer film of, for example, gold (Au) and an alloy of gold (Au) and zinc (Zn). Further, a second electrode 109 is formed on a back surface 101b of the substrate 101. The second electrode 109 is formed from a multilayer film of, for example, an alloy of gold (Au) and germanium (Ge), nickel (Ni) and gold (Au). In other words, in the surface-emitting laser 100 shown in FIG. 1 and FIG. 2, the first electrode 107 connects to the second mirror 104 on the columnar section 130, and the second electrode 109 connects to the substrate 101. An electric current is injected into the active layer 103 by the first electrode 107 and the second electrode 109.

The materials to form the first and second electrodes 107 and 109 are not limited to those described above, and, for instance, metals such as Cr, Ti, Ni, Au and Pt and alloys of these metals can be used depending on the requirements for adhesion enforcement, diffusion prevention or anti-oxidation, and the like.

Also, in accordance with the present embodiment, the description is made as to the case where the second electrode 109 is formed on the back surface 101b of the substrate 101, but the second electrode 109 may be provided on the upper surface 102a of the first mirror 102.

Figure 3:
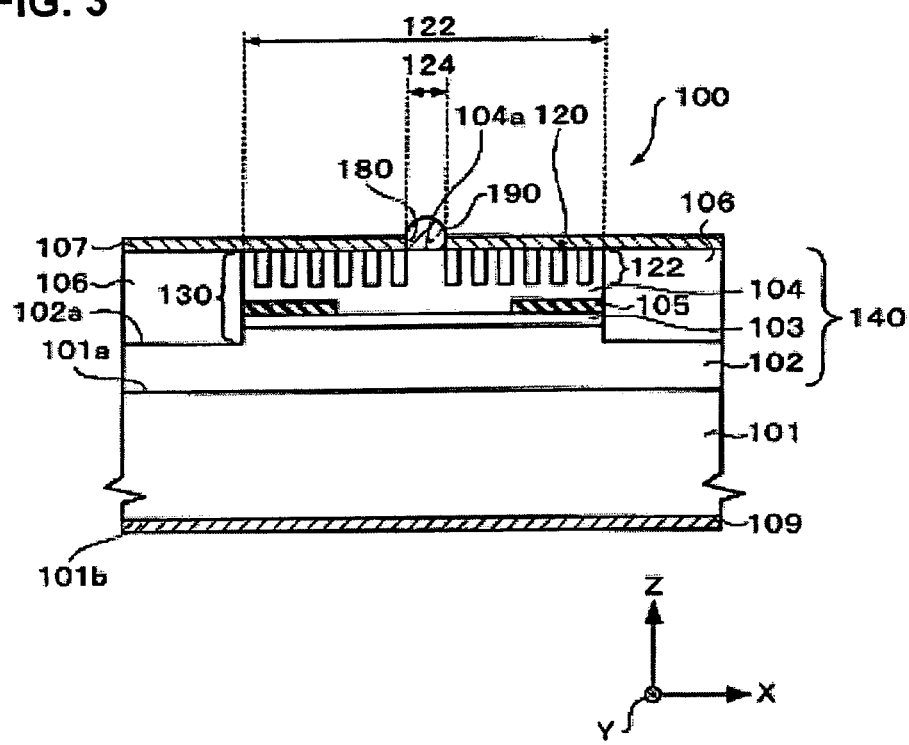
[FIG. 3] is a cross-sectional view schematically showing a surface-emitting laser in accordance with the first embodiment.

The lens section 190 is formed at least above the defect region 124. The lens section 190 can be formed over the photonic crystal region 122. The lens section 190 can be formed and dammed out by the first electrode 107. In other words, by controlling the plane configuration of the opening section 180 of the first electrode 107, the configuration of the lens section 190 can be controlled. For example, as shown in FIG. 3, the defect region 124 and the opening section 180 of the first electrode 107 may be matched with each other so that the lens section 190 can be made only on the defect region 124. In this case, compared to the example shown in FIG. 1, for example, the volume of the lens section 190 can be made smaller, such that the device can be miniaturized. Also, the time for forming the lens section 190 can be shortened. Also, the material cost for the lens section 190 can be reduced, which is economical.

In a plan view, the lens section 190 may be formed in a manner that its center concurs or generally concurs with the center of light emitted from the upper surface 104a of the second mirror 104.

The lens section 190 has a function to change the light path of the light emitted from the upper surface 104a of the second mirror 104. Concretely, the lens section 190 may have a function to focus, polarize or spectrally separate the light emitted from the upper surface 104a of the second mirror 104. The lens section 190 has a three-dimensional configuration according to its use and function. For example, the configuration of the lens section 190 may be a convex shape. More concretely, the configuration of the lens section 190 may be a shape in which a portion of a single globe is cut, as shown in FIG. 1 and FIG. 2.

1.2. Method for Manufacturing Surface-Emitting Type Semiconductor Laser

An example of a method for manufacturing a surface-emitting laser 100 in accordance with the first embodiment of the present invention is described with reference to FIG. 1, FIG. 2 and FIG. 4-FIG. 10. FIG. 4-FIG. 10 are cross-sectional views schematically showing a process for manufacturing the surface-emitting laser 100 in accordance with the present embodiment shown in FIG. 1 and FIG. 2, and correspond to the cross-sectional view of FIG. 1, respectively.

Figure 4:
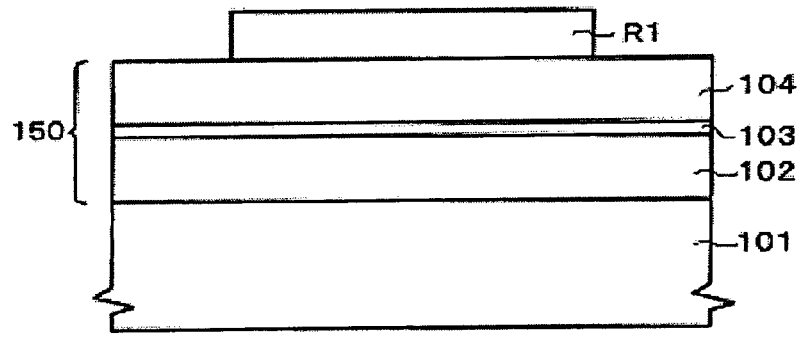
[FIG. 4] is a cross-sectional view schematically showing a method for manufacturing the surface-emitting laser in accordance with the first embodiment.

(1) First, on a substrate 101 composed of n-type GaAs, a semiconductor multilayer film 150 is formed by epitaxial growth while modifying its composition, as shown in FIG. 4. It is noted here that the semiconductor multilayer film 150 is formed from, for example, a first mirror 102 of 40 pairs of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, and a second mirror 104 of 25 pairs of alternately laminated p-type $Al_{0.9}Ga_{0.1}As$ layers and p-type $Al_{0.15}Ga_{0.85}As$ layers. These layers are successively laminated on the substrate 101 to thereby form the semiconductor multilayer film 150.

When growing the second mirror 104, at least one layer thereof adjacent to the active layer 103 may be formed as an AlAs layer or an AlGaAs layer that is later oxidized and becomes an oxidized constricting layer 105. The Al composition of the AlGaAs layer that becomes the oxidized constricting layer 105 is, for example, 0.95 or greater. In the present embodiment, the Al composition of the AlGaAs layer is a composition of aluminum (Al) with respect to the group III elements. The uppermost surface layer of the second mirror 104 may preferably be made to have a high carrier density such that it can readily have an ohmic contact with an electrode (first electrode 107).

The temperature at which the epitaxial growth is conducted is appropriately decided depending on the growth method, the kind of raw material, the type of the substrate 101, and the kind, thickness and carrier density of the semiconductor multilayer film 150 to be formed, and in general may preferably be 450° C.-800° C. Also, the time required for conducting the epitaxial growth is appropriately decided just like the temperature. Also, a metal-organic vapor phase growth (MOVPE: metal-organic vapor phase epitaxy) method, a molecular beam epitaxy (MBE) method or a liquid phase epitaxy (LPE) method can be used as a method for the epitaxial growth.

Then, resist is coated on the semiconductor multilayer film 150, and then the resist is patterned by a lithography method, thereby forming a resist layer R1 having a specified pattern, as shown in FIG. 4. The resist layer R1 is formed above an area where a columnar section 130 (see FIG. 1 and FIG. 2) is planned to be formed.

Figure 5:
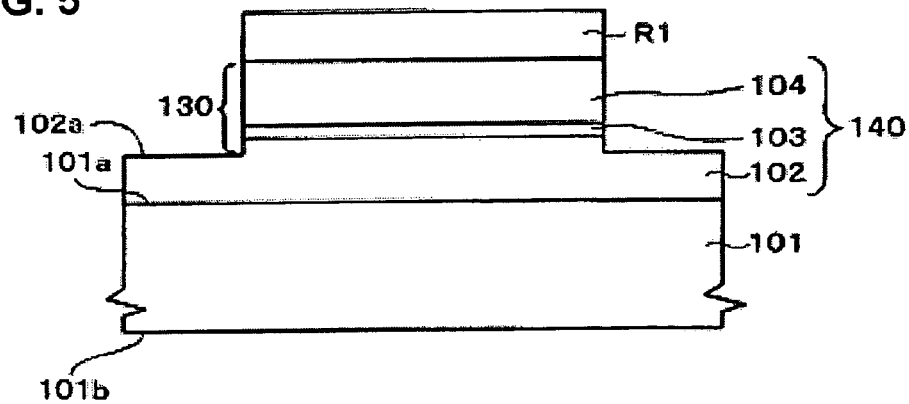
[FIG. 5] is a cross-sectional view schematically showing the method for manufacturing the surface-emitting laser in accordance with the first embodiment.

(2) Then, the second mirror 104, the active layer 103 and a part of the first mirror 102 are etched by, for example, a dry etching method, using the resist layer R1 as a mask, whereby a columnar semiconductor deposited body (columnar section) 130 is formed, as shown in FIG. 5. Then, the resist R1 is removed.

Figure 6:
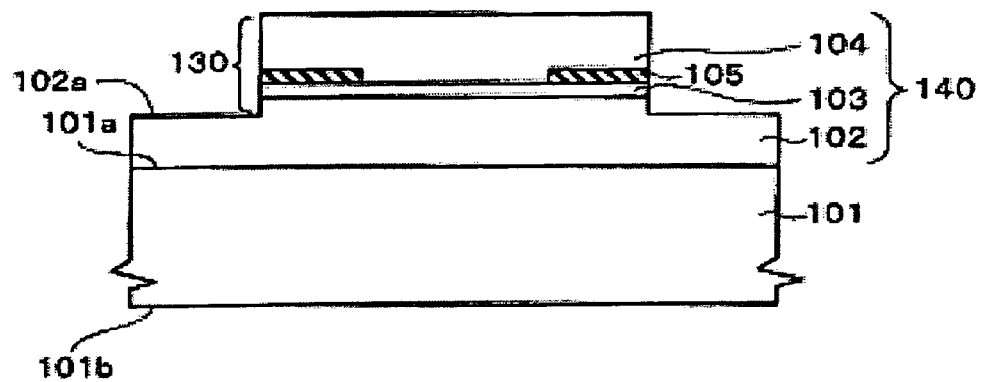
[FIG. 6] is a cross-sectional view schematically showing the method for manufacturing the surface-emitting laser in accordance with the first embodiment.

(3) Next, as shown in FIG. 6, by placing the substrate 101 on which the columnar section 130 is formed through the aforementioned steps in a water vapor atmosphere at about 400° C., for example, a layer having a high Al composition (a layer with an Al composition being, for example, 0.95 or higher) provided in the above-described second mirror 104 is oxidized from its side surface, thereby forming a oxidized constricting layer 105. The oxidation rate depends on the furnace temperature, the amount of water vapor that is supplied, and the Al composition and the film thickness of the layer to be oxidized. In the resonator 140 equipped with the oxidized constricting layer 105 that is formed by oxidation, a current flows only in a portion where the oxidized constricting layer 105 is not formed (a portion that is not oxidized). Accordingly, by controlling the range of the oxidized constricting layer 105 to be formed, in the step of forming the oxidized constricting layer 105 by oxidation, the current density can be controlled. The diameter of the circle of the portion where the oxidation constricting layer 105 is not formed can be appropriately set, but may be about 8 μm.

Figure 7:
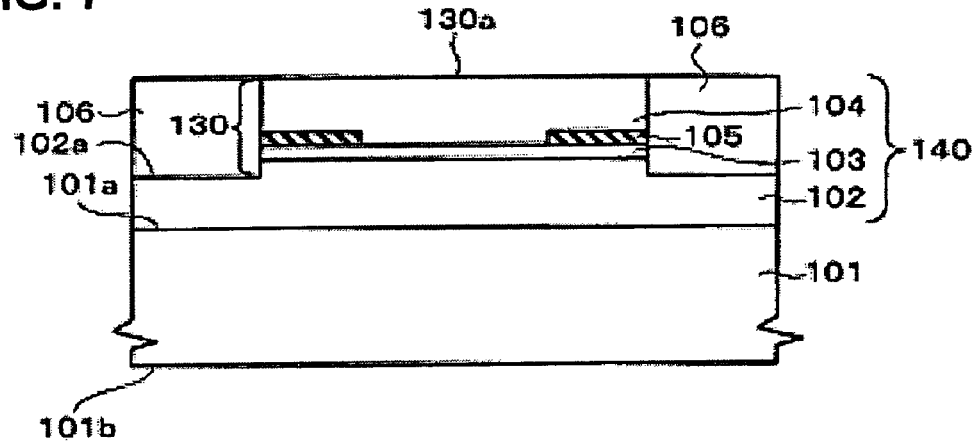
[FIG. 7] is a cross-sectional view schematically showing the method for manufacturing the surface-emitting laser in accordance with the first embodiment.

(4) Next, as shown in FIG. 7, an embedding dielectric layer 106 that surrounds the columnar section 130, in other words, a part of the first mirror 102, the active layer 103 and the second mirror 104 is formed.

Here, an example in which polyimide resin is used as a material for forming the embedding dielectric layer 106 is described. First, a precursor (polyimide precursor) is coated on the substrate 101 having the columnar section 130 by using, for example, a spin coat method, to thereby form a precursor layer. In this instance, the precursor layer is formed such that its film thickness becomes greater than the height of the columnar section 130. As the method of forming the precursor layer, besides the aforementioned spin coat method, another known technique, such as, a dipping method, a spray coat method, a droplet discharge method or the like can be used.

Then, the substrate 101 is heated by using, for example, a hot plate or the like, thereby removing solvent, and then placed in a furnace, for example, at about 350° C. to imidize the precursor layer, thereby forming a polyimide resin layer that is almost completely hardened. Then, as shown in FIG. 7, an upper surface 130a of the columnar section 130 is exposed, and the embedding dielectric layer 106 is formed. As a method for exposing the upper surface 130a of the columnar section 130, a CMP method, a dry etching method, a wet etching method or the like can be used. Also, the embedding dielectric layer 106 may be formed with a resin that has photosensitivity. The embedding dielectric layer 106 may be patterned by a lithography technique or the like depending on the requirements.

Figure 8:
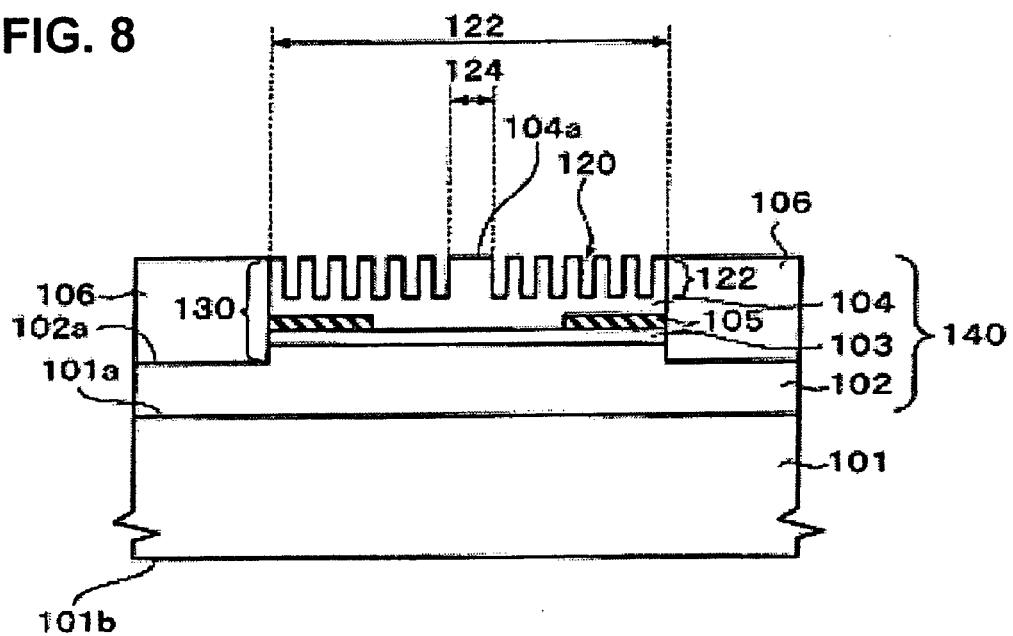
[FIG. 8] is a cross-sectional view schematically showing the method for manufacturing the surface-emitting laser in accordance with the first embodiment.

(5) Next, as shown in FIG. 8, a photonic crystal region 122 is formed in an upper portion of the second mirror 104. Concretely, holes 120 that are periodically arranged are formed in the upper portion of the second mirror 104. However, the holes 120 are not formed in a defect region 124. The holes 120 can be formed by using a lithography technique and an etching technique, or an EB (Electron Beam) processing technique. When a lithography technique and an etching technique are used, for example, a resist, SiN or the like can be used as a mask for etching.

(6) Next, the steps of forming a first electrode 107 and a second electrode 109 for injecting a current into the active layer 103 (see FIG. 1 and FIG. 2) are described.

Prior to forming the first electrode 107 and the second electrode 109, the columnar section 130 and the back surface 101b of the substrate 101 are washed by using a plasma treatment method or the like depending on the requirements. As a result, a device with more stable characteristics can be formed.

Figure 9:
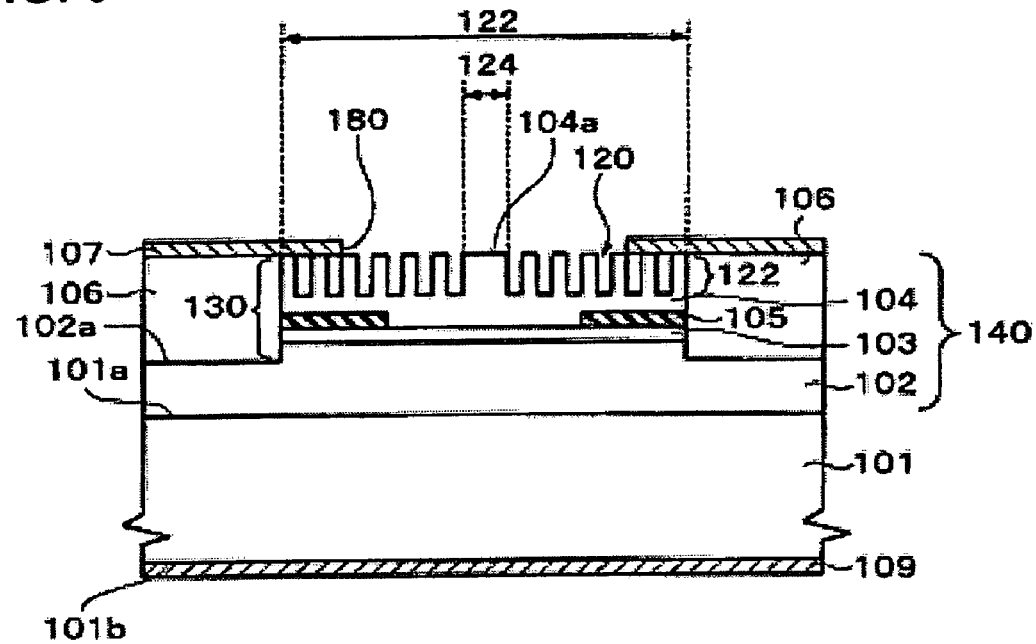
[FIG. 9] is a cross-sectional view schematically showing the method for manufacturing the surface-emitting laser in accordance with the first embodiment.

Then, as shown in FIG. 9, for example, a multilayer film (not shown) of an alloy of gold (Au) and zinc (Zn), and gold (Au) is formed by, for example, a vacuum deposition method on the upper surface of the columnar section 130 and the embedding dielectric layer 106. Then a portion where the multilayer film is not formed is formed on the upper surface of the columnar section 130 by a lift-off method. This portion becomes an opening section 180. As described above, by controlling the plane configuration of the opening section 180, the shape of the lens section 190 can be controlled.

Next, a multilayer film of an alloy of gold (Au) and germanium (Ge), nickel (Ni) and gold (Au), for example, is formed by, for example, a vacuum deposition method on the back surface 101b of the substrate 101.

Next, an annealing treatment is conducted, for example, in a nitrogen atmosphere. The annealing treatment may be conducted at temperatures of about 400° C., for example. The time for the annealing treatment may be, for example, 3 minuets.

By the steps described above, as shown in FIG. 9, the first electrode 107 and the second electrode 109 are formed. It is noted that, in the steps described above, a dry etching method or a wet etching method may be used instead of the lift-off method. Also, in the steps described above, a sputter method can be used instead of the vacuum deposition method. Also, the order of forming the first electrode 107 and the second electrode 109 is not particularly limited.

Figure 10:
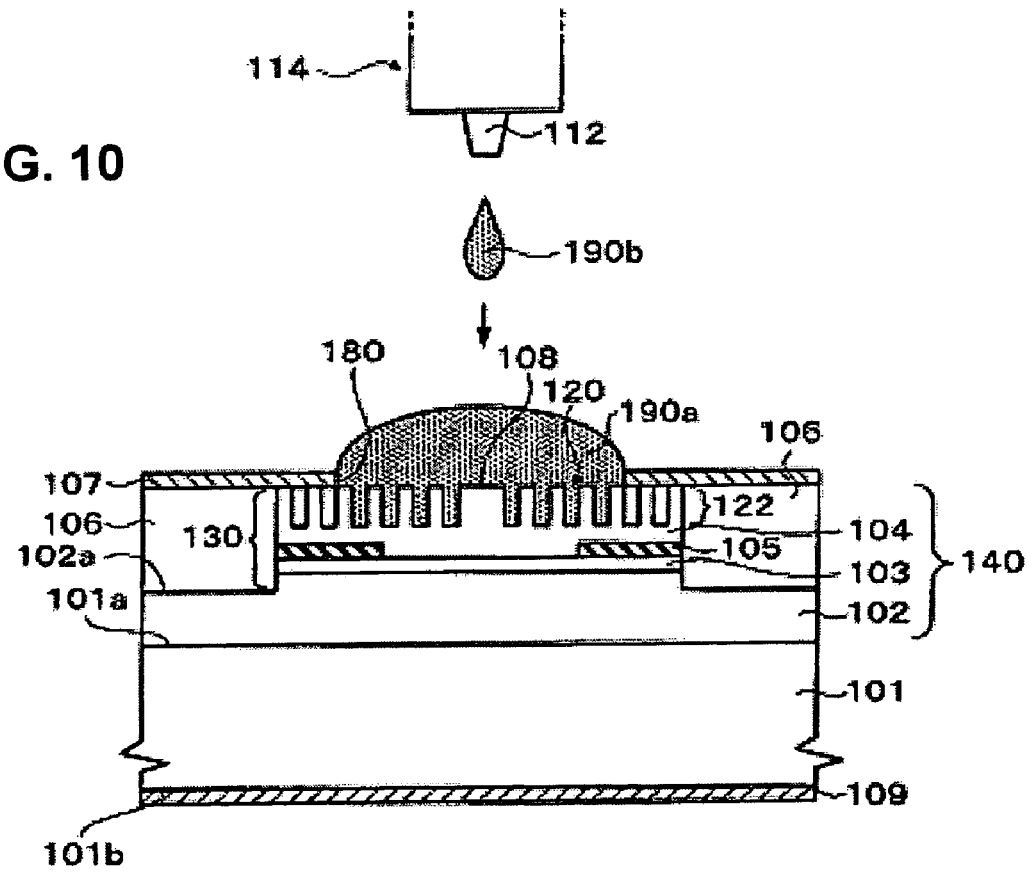
[FIG. 10] is a cross-sectional view schematically showing the method for manufacturing the surface-emitting laser in accordance with the first embodiment.

(7) Next, a lens section precursor 109a is formed. Concretely, as shown in FIG. 10, droplets 190b of liquid material for forming the lens section 190 are ejected onto the upper surface 104a of the second mirror 104, thereby forming the lens section precursor 109a. The liquid material has a property of hardening by application of energy (light, heat or the like). As the liquid material, for example, a precursor of ultraviolet-ray setting type resin or thermosetting type resin can be enumerated. As the ultraviolet-ray setting type resin, for example, ultraviolet-ray setting type acrylic resin and epoxy resin can be enumerated. Also, as the thermosetting type resin, thermosetting type polyimide resin can be enumerated.

As the method for ejecting the droplets 190b, for example, a dispenser method or a droplet discharge method can be enumerated. The dispenser method is a common method as a method for ejecting droplets, and is effective when the droplets 190b are discharged in a relatively wide area. Also, the droplet discharge method is a method of discharging droplets by using a droplet discharging head, and is capable of controlling the position at which droplets are discharged on the order of μm. Also, the amount of a droplet to be discharged can be controlled in a unit on the order of picoliter, such that the lens section 190 with a micro structure can be manufactured.

As the droplet discharge method, there are, for example, (i) a method in which a pressure is generated by changing the size of a bubble in liquid by heat to thereby discharge the liquid from an ink jet nozzle, and (ii) a method in which liquid is discharged from an ink jet nozzle by a pressure generated by a piezoelectric element. In view of pressure controllability, the method (ii) may be desirable.

The position of a nozzle 112 of an ink jet head 114 and the discharge position of droplets 190a are aligned by using a known image recognition technology that may be used in an exposure step and an examination step of a common process for manufacturing semiconductor integrated circuits. For example, as shown in FIG. 10, the position of the nozzle 112 of the ink jet head 114 and the opening section 180 of the first electrode 107 are aligned by image recognition. After they are aligned, the voltage to be applied to the ink jet head 114 is controlled, and then droplets 190b are discharged.

In this case, some variations may exist in the discharge angle of the droplets 190b that are discharged from the nozzle 112. However, if positions where the droplets 190b hit are inside the opening section 180, the lens section precursor 190a wets and spreads in the region encircled by the first electrode 107, and the positions are automatically corrected.

(8) Next, the lens section precursor 190a is hardened to form the lens section 190. Concretely, energy such as heat or light is applied to the lens section precursor 190a. For hardening the lens section precursor 190a, an appropriate method is used depending on the kind of the material of the lens section precursor 190a. Concretely, for example, application of thermal energy, and irradiation of light such as ultraviolet ray, laser beam or the like can be enumerated.

By the steps described above, the surface-emitting laser 100 in accordance with the present embodiment shown in FIG. 1 and FIG. 2 is obtained.

1.3. Action and Effect

The surface-emitting laser 100 in accordance with the present embodiment includes the photonic crystal region 122 and the lens section 190. The photonic crystal region 122 can well confine light in the defect region 124. Also, the lens section 190 can change the light path.

Because the surface-emitting laser 100 in accordance with the present embodiment has the photonic crystal region 122, laser light can be oscillated with a lower threshold value, compared to a surface-emitting laser that does not have the lens section 190 or the photonic crystal region 122 (hereafter also referred to as an "ordinary surface-emitting laser"). Further, because the surface-emitting laser 100 in accordance with the present embodiment has the photonic crystal region 122, the oxidized constricting layer 105 mainly performs current confinement. Accordingly, without increasing the number of optical modes, the diameter (constricting diameter) of the opening section of the oxidized constricting layer 105 can be made greater, compared to an ordinary surface-emitting laser. As a result, a large current can be injected in the active layer 103, and therefore laser light with a high power output can be obtained.

Also, because the surface-emitting laser 100 in accordance with the present embodiment has the lens section 190, its light path, as schematically illustrated, may be indicated by, for example, arrows A in FIG. 1. For example, in a surface-emitting laser that has the photonic crystal region 122 but does not have the lens section 190 (hereafter also referred to as a "PC surface-emitting laser"), because the photonic crystal region 122 has a good light confinement effect, the diameter of its oscillator (mode diameter) becomes smaller, and the radiation angle of laser light emitted from the oscillator 140 becomes wider, compared to an ordinary surface-emitting laser. In other words, the light path of the ordinary surface-emitting laser, as schematically illustrated, may be indicated by, for example, arrows N, and the light path of the PC surface-emitting laser, as schematically illustrated, may be indicated by, for example, arrows P. As shown in FIG. 1, because the surface-emitting laser 100 in accordance with the present embodiment has the lens section 190, its radiation angle can be made narrower, compared to the PC surface-emitting laser.

In other words, by the surface-emitting laser 100 in accordance with the present embodiment, laser light can be oscillated with a lower threshold value, and laser light with a higher power output can be obtained, compared to an ordinary surface-emitting laser; and the radiation angle can be made narrower, compared to a PC surface-emitting laser.

Figure 11:
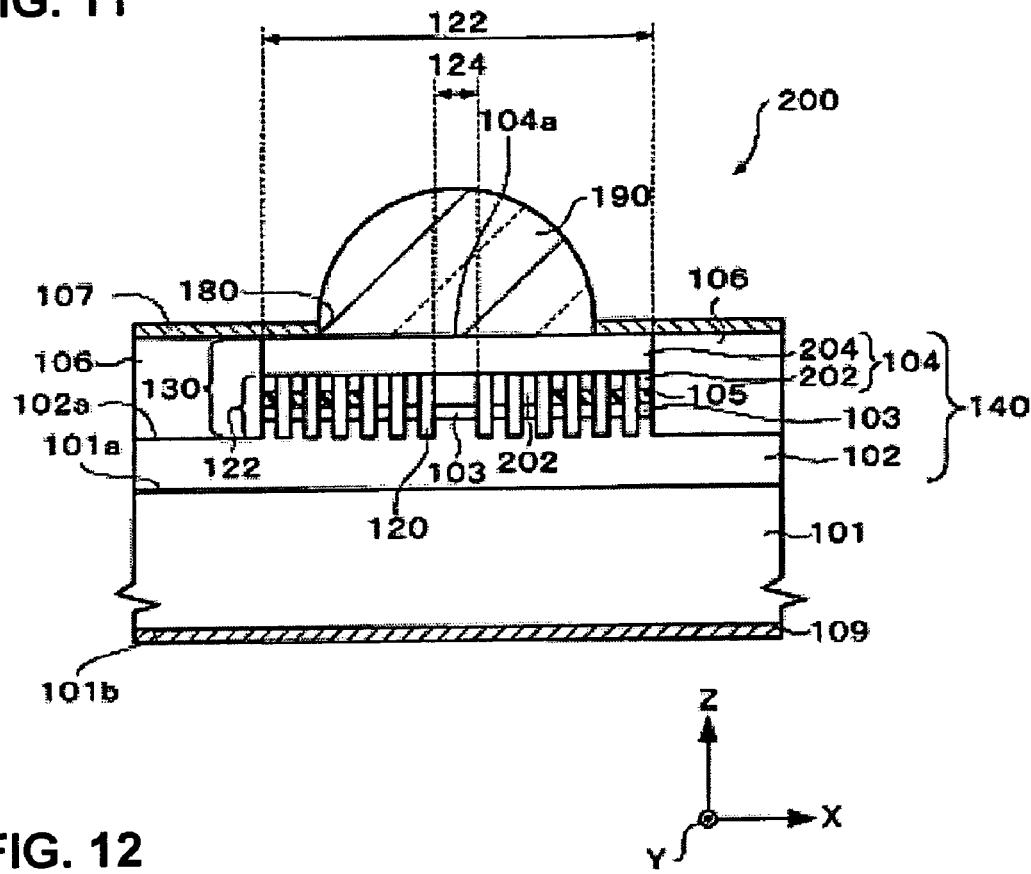
[FIG. 11] is a cross-sectional view schematically showing a surface-emitting laser in accordance with a second embodiment.

2. Second Embodiment 2.1. Next, a surface-emitting laser 200 in accordance with a second embodiment is described. It is noted that different aspects from the surface-emitting laser 100 of the first embodiment are mainly described, and descriptions of similar aspects are omitted. FIG. 11 is a cross-sectional view schematically showing the surface-emitting laser 200 in accordance with the second embodiment of the present invention. It is noted that the same reference numbers are appended to the same components as those of the surface-emitting laser 100 of the first embodiment.

A second mirror 104 of the surface-emitting laser 200 of the present embodiment includes, as shown in FIG. 11, a first semiconductor layer 202 and a second semiconductor layer 204 formed on the first semiconductor layer 202. The first semiconductor layer 202 is, for example, a DBR mirror composed of 5 pairs of semiconductor multilayer films of alternately laminated p-type $Al_{0.9}Ga_{0.1}As$ layers and p-type $Al_{0.15}Ga_{0.85}As$ layers. The second semiconductor layer 204 is, for example, a DBR mirror composed of 20 pairs of semiconductor multilayer films of alternately laminated p-type $Al_{0.9}Ga_{0.1}As$ layers and p-type $Al_{0.15}Ga_{0.85}As$ layers. It is noted that the composition of each of the layers and the number of layers forming the first semiconductor layer 202 and the second semiconductor layer 204 are not particularly limited.

A first mirror 102, an active layer 103 and the first semiconductor layer 202 each have a photonic crystal region 122 having a refractive index distribution that is periodic in their plane direction, respectively.

In the illustrated example, plural holes 120 extending in their thickness direction are formed in the photonic crystal region 122. The depth of the holes 120 is not particularly limited. For example, the holes 120 may be formed only in a part of the first semiconductor layer 202, or may be formed in a manner to penetrate the first semiconductor layer 202. Also, for example, the holes 120 may be formed in a manner to penetrate the first semiconductor layer 202, and further to dig into an intermediate point of the active layer 103, or may be formed in a manner to penetrate the active layer 103. Also, for example, the holes 120 may be formed in a manner to penetrate the active layer 103, and further to dig to an intermediate point of the first mirror 102 (as the illustrated example), or may be formed in a manner to penetrate the first mirror 102. It is noted that, in the illustrated embodiment, the holes 120 are formed penetrating the oxidized constricting layer 105.

The holes 120 may be filled with gas, such as, for example, air, nitrogen or the like. By this, for example, compared to a case in which the holes are filled with a dielectric member 320 as in a surface-emitting laser 300 in accordance with a third embodiment to be described below (see FIG. 21), the range of change in refractive index in the refractive index distribution of the photonic crystal region 122 becomes greater. Accordingly, light would more readily satisfy the total reflection condition in a plane direction, and the light confining effect can be enhanced.

2.2. Next, an example of a method for manufacturing the surface-emitting laser 200 in accordance with the second embodiment of the present invention is described with reference to FIG. 11-FIG. 18. It is noted that different aspects from the method for manufacturing the surface-emitting laser 100 of the first embodiment are mainly described, and descriptions of similar aspects are omitted. FIG. 12-FIG. 18 are cross-sectional views schematically showing a process for manufacturing the surface-emitting laser 200 of the present embodiment shown in FIG. 11, which correspond to the cross-sectional view shown in FIG. 11, respectively.

Figure 12:
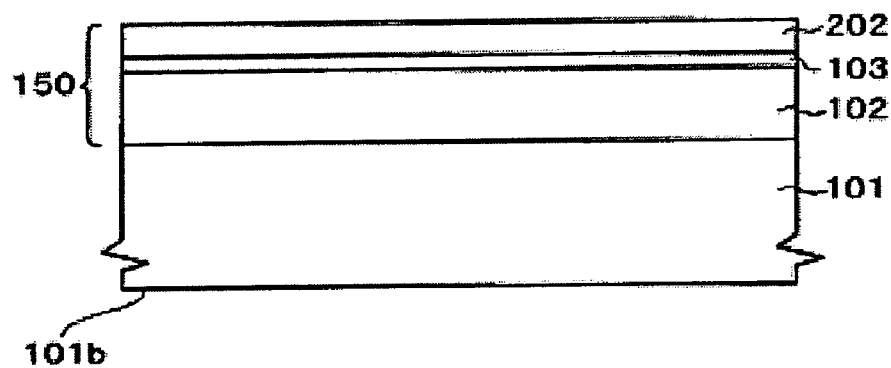
[FIG. 12] is a cross-sectional view schematically showing a method for manufacturing the surface-emitting laser in accordance with the second embodiment.

(1) First, on a substrate 101, a semiconductor multilayer film 150 is formed by epitaxial growth while modifying its composition, as shown in FIG. 12. It is noted here that the semiconductor multilayer film 150 is formed from, for example, a first mirror 102, an active layer 103 and a first semiconductor layer 202 of 5 pairs of alternately laminated p-type $Al_{0.9}Ga_{0.1}As$ layers and p-type $Al_{0.15}Ga_{0.85}As$ layers. These layers are successively laminated on the substrate 101 to thereby form the semiconductor multilayer film 150.

When growing the first semiconductor layer 202, at least one layer thereof adjacent to the active layer 103 may be formed as an AlAs layer or an AlGaAs layer that is later oxidized and becomes an oxidized constricting layer 105.

Figure 13:
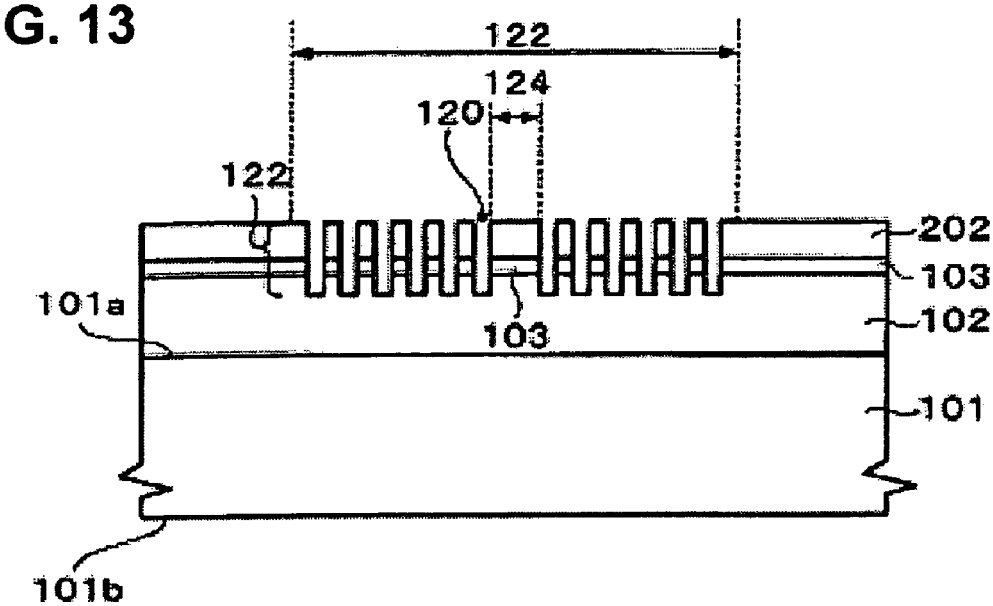
[FIG. 13] is a cross-sectional view schematically showing the method for manufacturing the surface-emitting laser in accordance with the second embodiment.

(2) Next, as shown in FIG. 13, a photonic crystal region 122 is formed in an upper portion of the first mirror 102, the active layer 103 and the first semiconductor layer 202. Concretely, holes 120 that are periodically arranged are formed in the upper portion of the first mirror 102, the active layer 103 and the first semiconductor layer 202. However, the holes 120 are not formed in a defect region 124.

Figure 14:
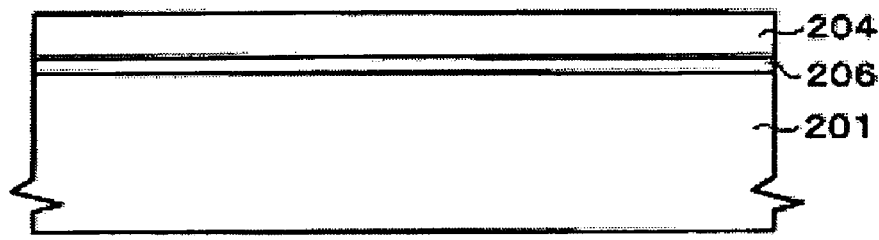
[FIG. 14] is a cross-sectional view schematically showing the method for manufacturing the surface-emitting laser in accordance with the second embodiment.

(3) Next, as shown in FIG. 14, a sacrificial layer 206 is formed on another substrate (a substrate different from the aforementioned substrate 101) 201, and a second semiconductor layer 204 is formed on the sacrificial layer 206. As the other substrate 201, for example, a GaAs substrate or the like can be used. The sacrificial layer 206 may be composed of, for example, AlAs. The second semiconductor layer 204 is a semiconductor multilayer film and is formed by epitaxial growth while modifying its composition. The second semiconductor layer 204 is composed of, for example, 20 pairs of semiconductor multilayer films of alternately laminated p-type $Al_{0.9}Ga_{0.1}As$ layers and p-type $Al_{0.15}Ga_{0.85}As$ layers.

Figure 15:
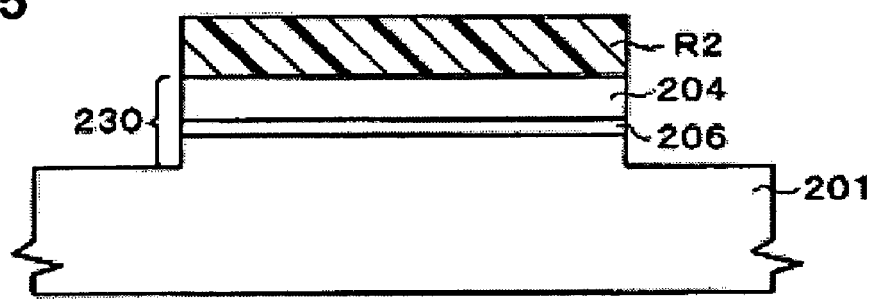
[FIG. 15] is a cross-sectional view schematically showing the method for manufacturing the surface-emitting laser in accordance with the second embodiment.

(4) Next, as shown in FIG. 15, a resist layer R2 having a predetermined pattern is formed on the second semiconductor layer 204. The plane configuration of the resist layer R2 may be the same as the plane configuration of a columnar section (see FIG. 11), for example. In other words, when the plane configuration of the columnar section 130 is a circle, the plane configuration of the resist layer R2 can be a circle with the same diameter.

Alternatively, for example, the area of the resist layer R2 in a plan view may be made broader than the area of the columnar section 130 in a plan view. By this, a greater margin for alignment can be secured in a step of fusing the first semiconductor layer 202 and the second semiconductor layer 204 to be described below. As a concrete example, for example, when the plane configuration of the columnar section 130 is a circle, the plane configuration of the resist layer R2 may be a circle having a diameter greater than the diameter of the circle of the plane configuration of the columnar section 130. It is noted that, if the area of the resist layer R2 in a plan view is broader than the area of the columnar section 130 in a plan view, the plane configuration of the resist layer R2 can be in any arbitrary configuration.

Next, by using the resist layer R2 as a mask, etching is conducted by, for example, a dry etching method, until at least side surfaces of the sacrificial layer 206 are exposed. For example, the second semiconductor layer 204, the sacrificial layer 206 and a part of the other substrate 201 are etched, whereby a columnar semiconductor deposited body 230 is formed, as shown in FIG. 15. Then, the resist layer R2 is removed.

Figure 16:
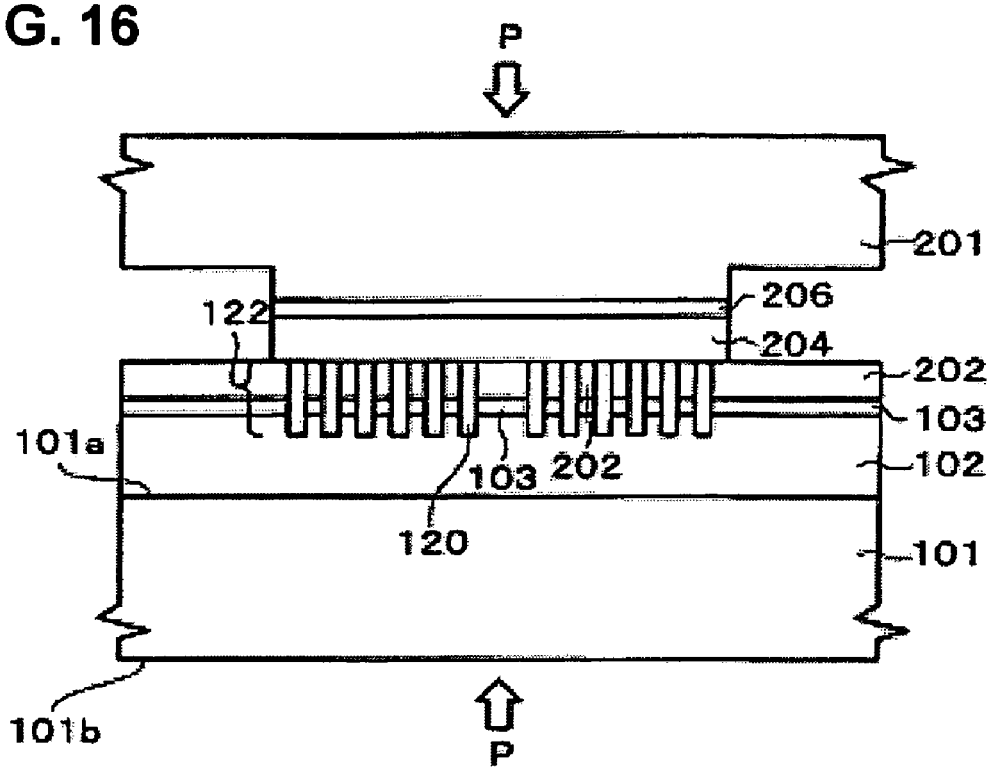
[FIG. 16] is a cross-sectional view schematically showing the method for manufacturing the surface-emitting laser in accordance with the second embodiment.

(5) Next, an upper surface of the first semiconductor layer 202 (see FIG. 13) formed above the substrate 101 and an upper surface of the second semiconductor layer 204 (see FIG. 15) formed above the other substrate 201 are fused and bonded together. More concretely, for example, as shown in FIG. 16, the other substrate 201 with the second semiconductor layer 204 formed thereon is turned upside down, and placed on the upper surface of the first semiconductor layer 202, and a pressure is applied to them while heating. By this, the upper surface of the first semiconductor layer 202 and the lower surface of the second semiconductor layer 204 are fused together. The temperature and the pressure P for fusing them may be appropriately set according to the kinds of the first semiconductor layer 202 and the second semiconductor layer 204.

When the second semiconductor layer 204 is placed on the upper surface of the first semiconductor layer 202, they are aligned such that, in a step of forming a columnar section 130 to be described below (see FIG. 18), no step difference is generated on side surfaces of the formed columnar section 130. In other words, in the step of forming the columnar section 130, the side surface of the second semiconductor layer 204 and the side surface of the first semiconductor layer 202, which the formed columnar section 130 has, are aligned to be continuous. Accordingly, as described above, if the area of the resist layer R2 (see FIG. 15) in a plan view is made broader than the area of the columnar section 130 in a plan view, the margin for alignment in this step can be made greater.

Figure 17:
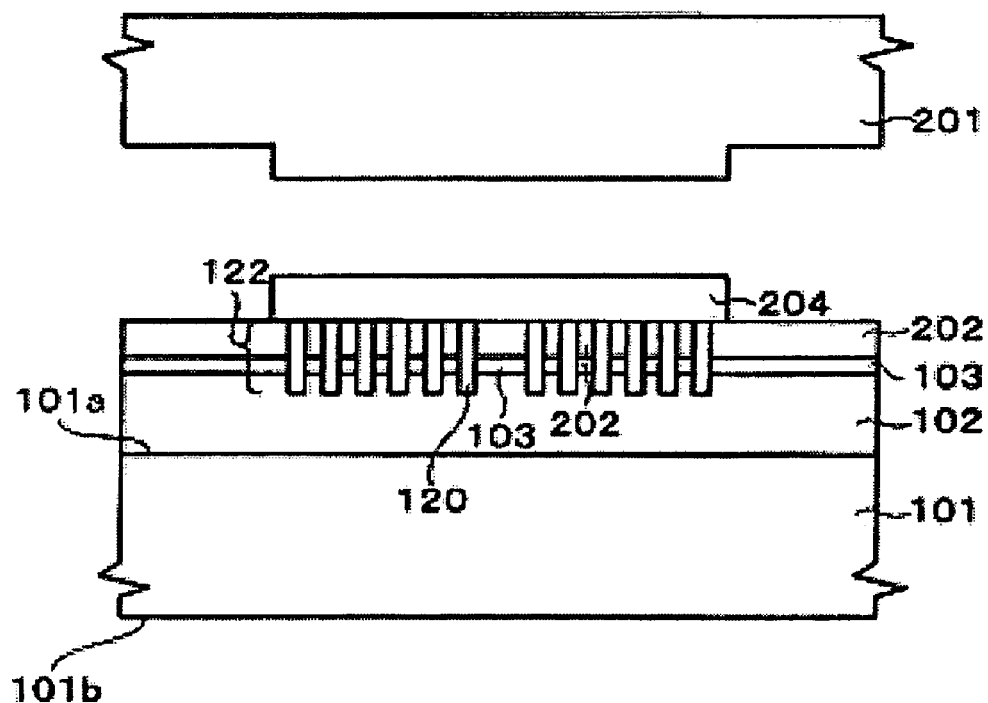
[FIG. 17] is a cross-sectional view schematically showing the method for manufacturing the surface-emitting laser in accordance with the second embodiment.

(6) Next, the sacrificial layer 206 is selectively etched from its exposed side surfaces. By this, as shown in FIG. 17, the other substrate 201 is separated (lifted off) from the second semiconductor layer 204. When an AlAs layer is used as the sacrificial layer 206, for example, low concentration hydrochloric acid having a high selectivity to AlAs may be used as an etchant of the sacrificial layer 206.

Figure 18:
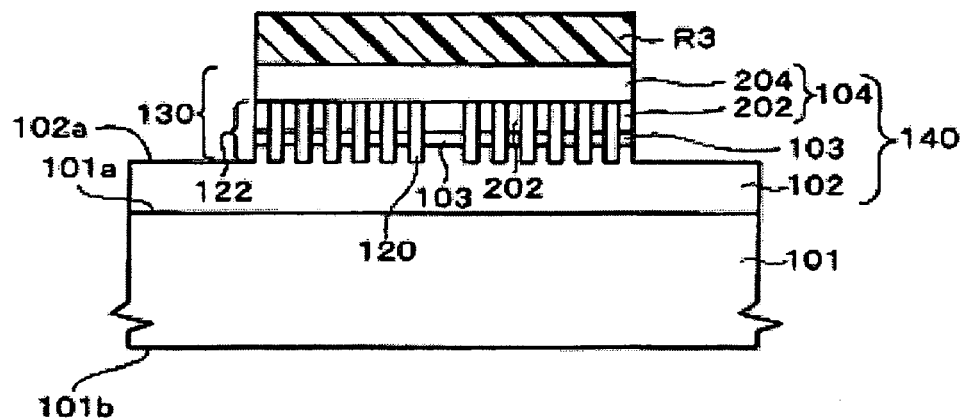
[FIG. 18] is a cross-sectional view schematically showing the method for manufacturing the surface-emitting laser in accordance with the second embodiment.

(7) Next, as shown in FIG. 18, a resist layer R3 having a predetermined pattern is formed on the second semiconductor layer 204. The resist layer R3 is formed above an area where the columnar section 130 (see FIG. 11) is planned to be formed.

Next, by using the resist layer R3 as a mask, the first semiconductor layer 202, the active layer 103 and a portion of the first mirror 102 are etched by, for example, a dry etching method, whereby a columnar semiconductor deposited body (columnar section) 130 is formed, as shown in FIG. 18. Then, the resist layer R3 is removed.

(8) Next, an oxidized constricting layer 105 is formed in a manner similar to the process for manufacturing the semiconductor layer 100 in accordance with the first embodiment. In this step, the first semiconductor layer 202 is oxidized from its side surfaces toward its inner side, wrapping around the holes 120, whereby the oxidized constricting layer 105 is formed. In other words, it is possible that the oxidized constricting layer 105 is not formed inside the holes 120.

(9) Next, an embedding dielectric layer 106, a first electrode 107, a second electrode 109 and a lens section 190 are formed in a manner similar to the process for manufacturing the surface-emitting laser 100 in accordance with the first embodiment.

By the steps described above, the surface-emitting laser 200 in accordance with the present embodiment shown in FIG. 11 is obtained.

Figure 19:
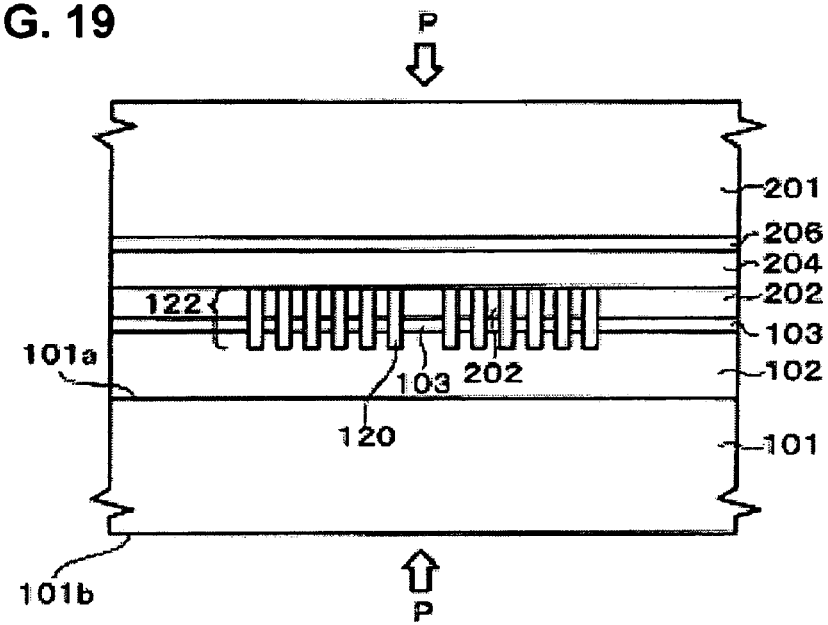
[FIG. 19] is a cross-sectional view schematically showing the method for manufacturing the surface-emitting laser in accordance with the second embodiment.

It is noted that the above example is described as to the case where the semiconductor deposited body 230 (see FIG. 15) is formed, and then the first semiconductor layer 202 and the second semiconductor layer 204 are fused and bonded together. However, the order of these steps can be reversed. In other words, first, as shown in FIG. 19, the other substrate 201 which is completed up to the second semiconductor layer 204 (see FIG. 14) is turned upside down, and an upper surface of the first semiconductor layer 202 and a lower surface of the second semiconductor layer 204 are fused together.

Figure 20:
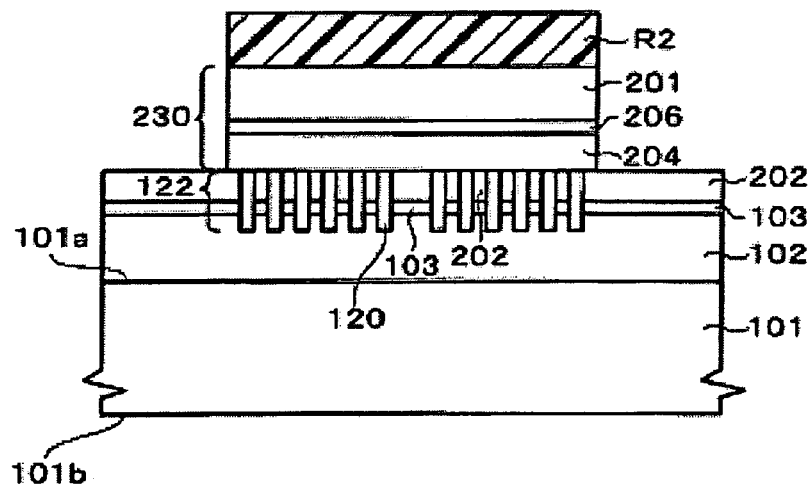
[FIG. 20] is a cross-sectional view schematically showing the method for manufacturing the surface-emitting laser in accordance with the second embodiment.

Next, depending of the necessity, the entire upper surface of the other substrate 201 is polished. Next, as shown in FIG. 20, by using a resist layer R2 as a mask, etching is conducted until at least side surfaces of the sacrificial layer 206 are exposed, whereby a columnar semiconductor deposited body 230 is formed. In this instance, the etching may preferably be conducted in a manner that the side surface of a layer that becomes an oxidized constricting layer 105 would not be exposed. By this, in the step of etching the sacrificial layer 206 to separate the other substrate 201 from the second semiconductor layer 204 (see FIG. 17), the layer that becomes the oxidized constricting layer 105 can be prevented from being etched.

Succeeding steps are similar to those of the example described above.

2.3. By the surface-emitting laser 200 in accordance with the present embodiment, like the first embodiment, laser light can be oscillated with a lower threshold value, and laser light with a higher power output can be obtained, compared to an ordinary surface-emitting laser; and the radiation angle can be made narrower, compared to a PC surface-emitting laser.

Also, the method for manufacturing the surface-emitting laser 200 of the present embodiment is different from the method for manufacturing the surface-emitting laser 100 of the first embodiment in that the holes 120 are formed not by digging from the upper surface of the second mirror 104, but by digging from the upper surface of the first semiconductor layer 202 that is a part of the second mirror 104. For this reason, the holes 120 can be readily formed in the active layer 103 and the first mirror 102. For example, by forming the holes 120 in the active layer 103 or in a region adjacent to the active layer 103, the effect of the photonic crystal can be enhanced.

Also, the method for manufacturing the surface-emitting laser 200 of the present embodiment is different from the method for manufacturing the surface-emitting laser 100 of the first embodiment in that, when the lens section 190 is formed, the holes 120 are covered by the second semiconductor layer 204. For this reason, the material of the lens section 190 would not enter the holes 120. Accordingly, the material within the holes 120 and the material of the lens section 190 can be selected independently from each other. Also, without depending on the material of the lens section 190, the characteristics of the photonic crystal region 122 can be set.

2.4. It is noted that the above example is described as to the case where the first mirror 102, the active layer 103 and the first semiconductor layer 202 have the photonic crystal region 122. However, for example, only the active layer 103 or the first mirror 102 may have the photonic crystal region 122. Also, for example, the active layer 103 and the first mirror 102 can have the photonic crystal region 122. For example, a manufacturing method in which only the first mirror 102 has the photonic crystal region 122 is described below. It is noted that other cases may be similar to the above, and therefore their description is omitted. Also, different aspects from the case where the first mirror 102, the active layer 103 and the first semiconductor layer 202 have the photonic crystal region 122 are mainly described, and descriptions of similar aspects are omitted.

First, in the step of forming the semiconductor multilayer film 150 above a substrate 101 (see FIG. 12), the first mirror 102 is formed in its entirety or in part, and the active layer 103 and the first semiconductor layer 202 are not formed. Then in the step of forming the photonic crystal region 122 (see FIG. 13), the photonic crystal region 122 is formed in the first mirror 102. Next, in the step of forming the second semiconductor layer 204 above another substrate 201 (see FIG. 14), the first semiconductor layer 202 and the active layer 103 are successively formed above the second semiconductor layer 204. It is noted that a part of the first mirror 102 may be formed on the active layer 103. Next, in the step of forming the columnar semiconductor laminated body 230 (see FIG. 15), the semiconductor laminated body 230 is formed in a manner to further include the first semiconductor layer 202 and the active layer 103. It is noted that the semiconductor laminated body 230 may further include a part of the first mirror 102. Next, in the laminating step (see FIG. 16), the active layer 103 and the first mirror 102, or the first mirrors 102 are fused and bonded together. Succeeding steps are similar to the above-described case where the first mirror 102, the active layer 103 and the first semiconductor layer 202 have the photonic crystal region 122, respectively.

Figure 21:
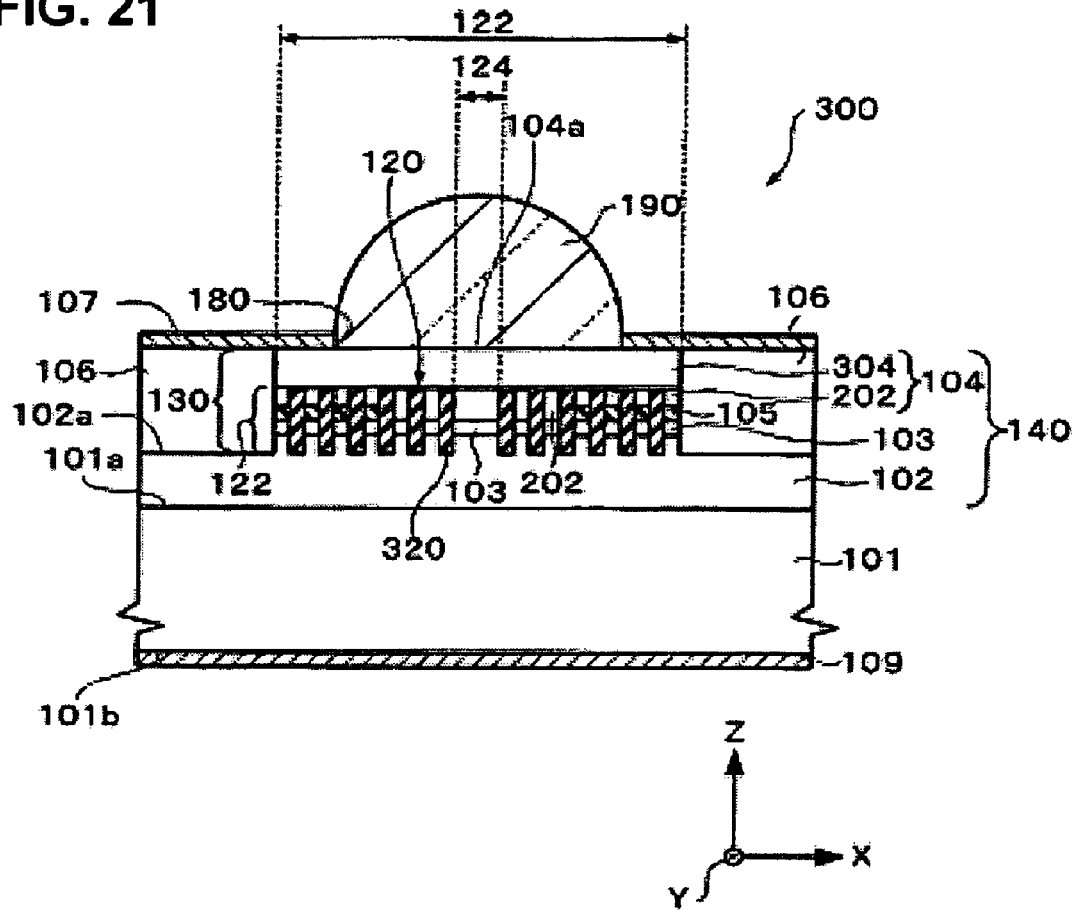
[FIG. 21] is a cross-sectional view schematically showing a surface-emitting laser in accordance with a third embodiment.

3. Third Embodiment 3.1. Next, a surface-emitting laser 300 in accordance with a third embodiment is described. It is noted that different aspects from the surface-emitting laser 200 of the second embodiment are mainly described, and descriptions of similar aspects are omitted. FIG. 21 is a cross-sectional view schematically showing the surface-emitting laser 300 in accordance with the third embodiment of the present invention. It is noted that the same reference numbers are appended to the same components as those of the surface-emitting laser 200 of the second embodiment.

A second mirror 104 of the surface-emitting laser 300 in accordance with the present embodiment includes, as shown in FIG. 21, a first semiconductor layer 202 and a second semiconductor layer 304 formed on the first semiconductor layer 202. The first semiconductor layer 202 is, for example, a DBR mirror composed of 5 pairs of semiconductor multilayer films of alternately laminated p-type $Al_{0.9}Ga_{0.1}As$ layers and p-type $Al_{0.15}Ga_{0.85}As$ layers. The second semiconductor layer 304 is, for example, a DBR mirror composed of 20 pairs of semiconductor multilayer films of alternately laminated p-type $Al_{0.9}Ga_{0.1}As$ layers and p-type $Al_{0.15}Ga_{0.85}As$ layers. It is noted that the composition of each of the layers and the number of layers forming the first semiconductor layer 202 and the second semiconductor layer 304 are not particularly limited.

Holes 120 in the surface-emitting laser 300 in accordance with the present embodiment may be filled with a dielectric member 320, as shown in FIG. 21. By this, the range of change in refractive index in the refractive index distribution in the photonic crystal region 122 becomes smaller, compared to the case where the holes 120 are not filled with the dielectric member 320. Accordingly, in the plane direction, the number of modes of light that satisfy the total reflection condition can be reduced. As a result, the number of modes of laser light emitted from the resonator 140 can be reduced, and for example, the laser light emitted from the resonator 140 can be made to have a single mode.

Furthermore, compared to the case where the holes 120 are not filled with the dielectric member 320, the number of modes of light to be emitted from the resonator 140 can be made difficult to increase even when the area of the defect region 124 in a plan view is increased. When the area of the defect region 124 in a plan view becomes greater, the radiation angle of laser light emitted from the resonator 140 becomes narrower. Accordingly, if the holes 120 are filled with the dielectric member 320, laser light with a fewer number of modes and a narrower radiation angle can be emitted from the resonator 140.

As the dielectric member 320, for example, SiN, $SiO_2$, Ti, TiN, $TiO_2$, $Ta_2O_3$, a-Si or the like can be used.

3.2. Next, an example of a method for manufacturing the surface-emitting laser 300 in accordance with the third embodiment of the present embodiment is described with reference to FIG. 21-FIG. 25. It is noted that different aspects from the method for manufacturing the surface-emitting laser 200 of the second embodiment are mainly described, and descriptions of similar aspects are omitted. FIG. 22-FIG. 25 are cross-sectional views schematically showing a process for manufacturing the surface-emitting laser 300 in accordance with the third embodiment shown in FIG. 21, which correspond to the cross-sectional view shown in FIG. 21, respectively.

(1) First, the steps up to forming a photonic crystal region 122 are conducted (see FIG. 12 and FIG. 13), in a manner similar to the process for manufacturing the surface-emitting laser 200 of the second embodiment.

Figure 22:
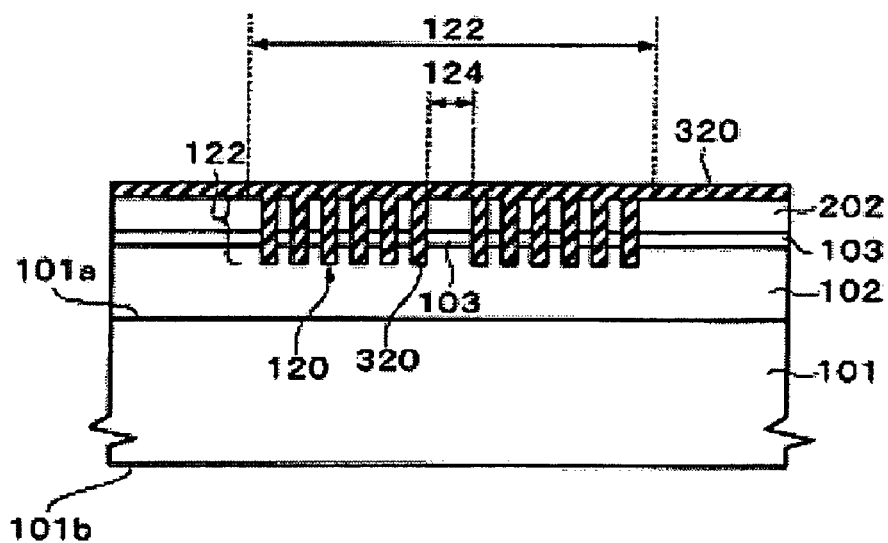
[FIG. 22] is a cross-sectional view schematically showing a method for manufacturing the surface-emitting laser in accordance with the third embodiment.

(2) Then, a dielectric member 320 is formed in a manner to embed holes 120, as shown in FIG. 22. The dielectric member 320 is formed also on a first semiconductor layer 202. The dielectric member 320 may be formed by, for example, a sputter method, a plasma CVD method or the like.

Figure 23:
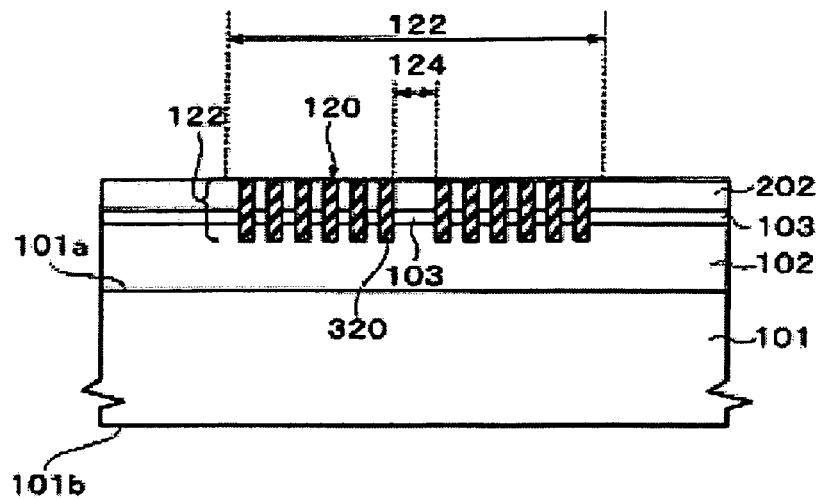
[FIG. 23] is a cross-sectional view schematically showing the method for manufacturing the surface-emitting laser in accordance with the third embodiment.

(3) Then, as shown in FIG. 23, the dielectric member 320 is removed from its upper surface side. The removal of the dielectric member 320 is conducted until an upper surface of the first semiconductor layer 202 is exposed. The removal of the dielectric member 320 can be conducted by, for example, a wet etching method, a dry etching method, a chemical mechanical polishing (CMP) method or the like.

Figure 24:
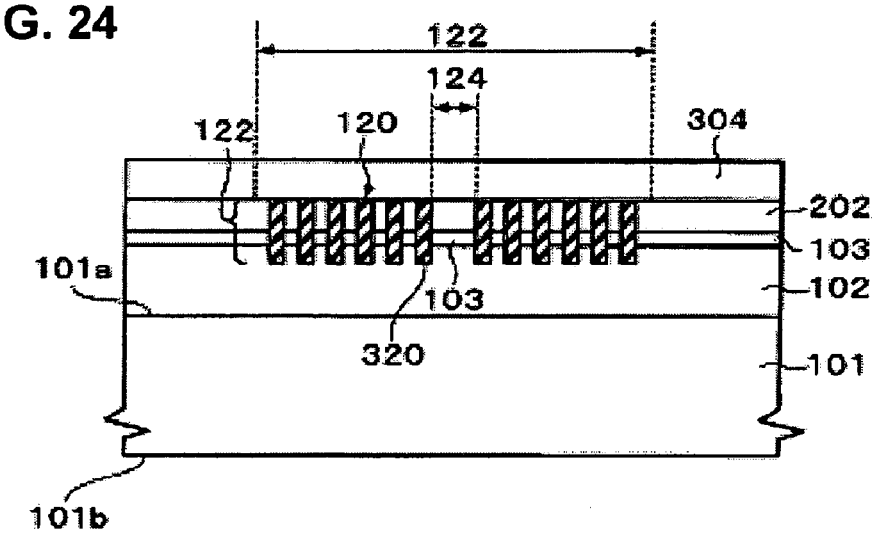
[FIG. 24] is a cross-sectional view schematically showing the method for manufacturing the surface-emitting laser in accordance with the third embodiment.

(4) Next, as shown in FIG. 24, a second semiconductor layer 304 is formed over the first semiconductor layer 202 and the dielectric member 320. The second semiconductor layer 304 is a semiconductor multilayer film and is formed by epitaxial growth while modifying its composition. The second semiconductor layer 304 is composed of, for example, 20 pairs of semiconductor multilayer films of alternately laminated p-type $Al_{0.9}Ga_{0.1}As$ layers and p-type $Al_{0.15}Ga_{0.85}As$ layers. The second semiconductor layer 304 may be formed by, for example, a MOCVD method or the like.

Figure 25:
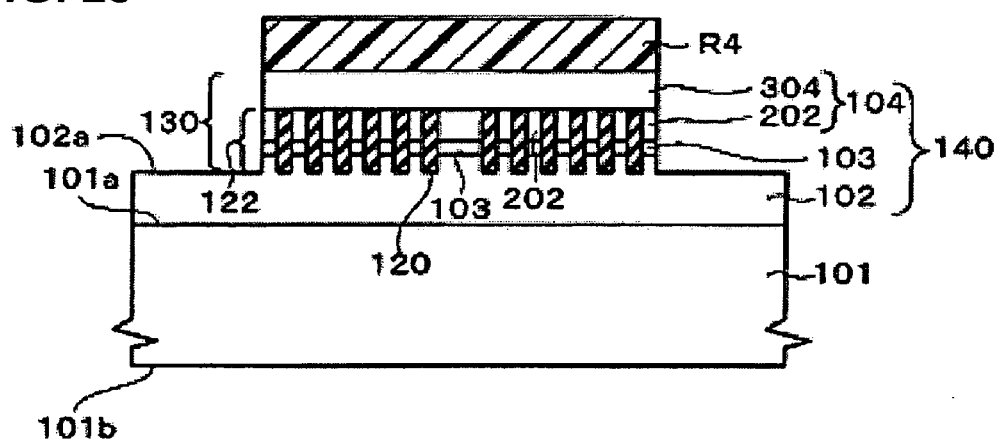
[FIG. 25] is a cross-sectional view schematically showing the method for manufacturing the surface-emitting laser in accordance with the third embodiment.

(5) Next, a resist layer R4 having a predetermined pattern is formed on the second semiconductor layer 304. The resist layer R4 is formed above an area where a columnar section 130 (see FIG. 21) is planned to be formed. Next, as shown in FIG. 25, by using the resist layer R4 as a mask, the second semiconductor layer 304, the first semiconductor layer 202, the active layer 103 and a part of the first mirror 102 are etched, to form a columnar semiconductor deposited body (columnar section) 130. Then, the resist layer R4 is removed.

(6) Next, an oxidized constricting layer 105, an embedding dielectric layer 106, a first electrode 107, a second electrode 109 and a lens section 190 are formed in a manner similar to the process for manufacturing the surface-emitting laser 200 in accordance with the second embodiment.

By the steps described above, the surface-emitting laser 300 in accordance with the present embodiment shown in FIG. 21 is obtained.

3.3. By the surface-emitting laser 300 in accordance with the present embodiment, like the second embodiment, laser light can be oscillated with a lower threshold value, and laser light with a higher power output can be obtained, compared to an ordinary surface-emitting laser; and the radiation angle can be made narrower, compared to a PC surface-emitting laser.

4. Fourth Embodiment

Figure 26:
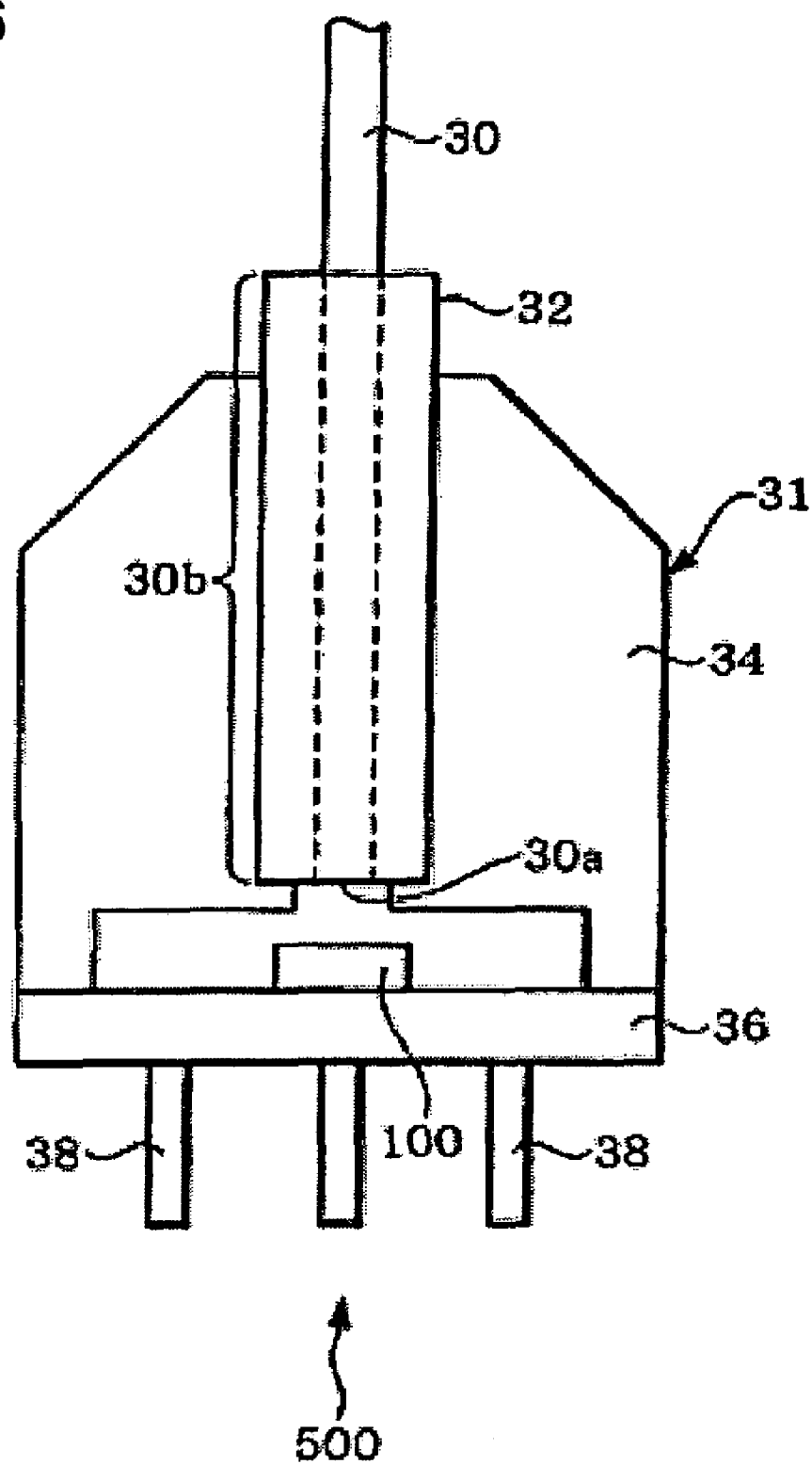
[FIG. 26] is a view schematically showing an optical module in accordance with a fourth embodiment.

FIG. 26 is a cross-sectional view schematically showing an optical module 500 in accordance with a fourth embodiment of the present invention. The optical module 500 of the present embodiment includes a surface-emitting laser, such as, for example, the surface-emitting laser 100 in accordance with the first embodiment. It is noted that the present embodiment is described as to an example in which the surface-emitting laser 100 of the first embodiment is applied as the surface-emitting laser. However, as the surface-emitting laser, the surface-emitting laser 200 of the second embodiment, or the surface-emitting laser 300 of the third embodiment can also be applied. This applies similarly to fifth and sixth embodiments to be described below.

The optical module 500 is a light transmission module that leads a laser beam emitted from the surface-emitting laser 100 into an optical fiber 30 to be propagated therein. The optical module 500 includes, as shown in FIG. 26, the surface-emitting laser 100, the optical fiber (optical waveguide path) 30, and a housing 31. The housing 31 includes a base 36 and a fiber holder 34. The surface-emitting laser 100 is formed on the base 36. In other words, the surface-emitting laser 100 is affixed to the base 36. More concretely, the surface-emitting laser 100 is affixed to the base 36 such that the side of the second electrode 109 of the surface-emitting laser 100 faces the base 36. By this, the upper surface 104a of the second mirror 104 of the surface-emitting laser 100 is disposed in a manner to oppose to an end face 30a of the optical fiber 30.

The end section 30b of the optical fiber 30 and the surface-emitting laser 100 are formed inside the fiber holder 34. More concretely, the end section 30b of the optical fiber 30 is provided inside a ferrule 32, and the ferrule 32 is attached inside the fiber holder 34.

The optical module 500 is assembled through inserting the end section 30b of the optical fiber 30 in the ferrule 32, attaching the ferrule 32 to the fiber holder 34, and then connecting the fiber holder 34 to the base 36 to which the surface-emitting laser 100 is attached. It is noted that, in the illustrated example, the optical module 500 is formed without placing an optical component (for example, a lens) between the surface-emitting laser 100 and the optical fiber 30, but an optical component may be provided between the surface-emitting laser 100 and the optical fiber 30.

5. Fifth Embodiment

Figure 27:
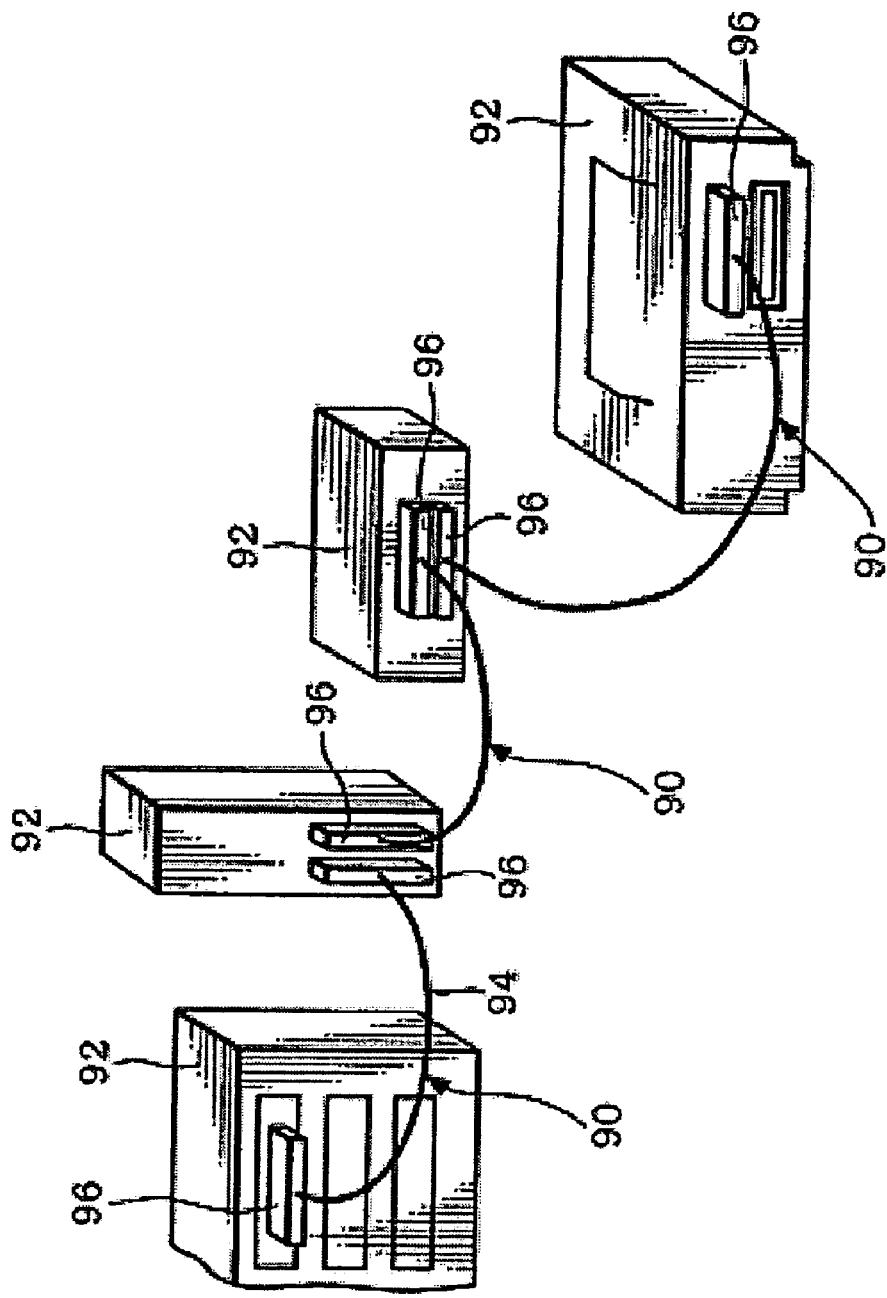
[FIG. 27] is a diagram showing optical transmission devices in accordance with a fifth embodiment of the present invention.

FIG. 27 is a diagram showing optical transmission devices in accordance with a fifth embodiment of the present invention. The optical transmission devices 90 mutually connect electronic devices 92 such as computers, display devices, storage devices, printers and the like. The electronic devices 92 may be data communication devices. The optical transmission device 90 may include a cable 94 and plugs 96 provided on both sides thereof. The cable 94 includes the optical fiber 30 of the optical module 500 (see FIG. 26). The plug 96 internally includes an optical coupling section between the optical fiber 30 of the optical module 500 and the surface-emitting laser 100. It is noted that, because the optical fiber 30 is provided inside the cable 94, and the surface-emitting laser 100 is provided inside the plug 96, they are not shown in FIG. 27. The optical fiber 30 and the surface-emitting laser 100 are attached in a manner described in the fourth embodiment.

The surface-emitting laser 100 is provided at one end of the optical fiber 30, and a light receiving element (not shown) is provided at the other end of the optical fiber 30. The light receiving element converts an inputted light signal into an electrical signal, and then inputs the electrical signal in the electronic device 92. On the other hand, an electrical signal outputted from the electronic device 92 is converted to an optical signal by the surface-emitting laser 100. The optical signal is transmitted through the optical fiber 30, and inputted in the light receiving element.

As described above, by the optical transmission device 90 of the present embodiment, data can be transmitted among the electronic devices 92 by optical signals.

6. Sixth Embodiment

Figure 28:
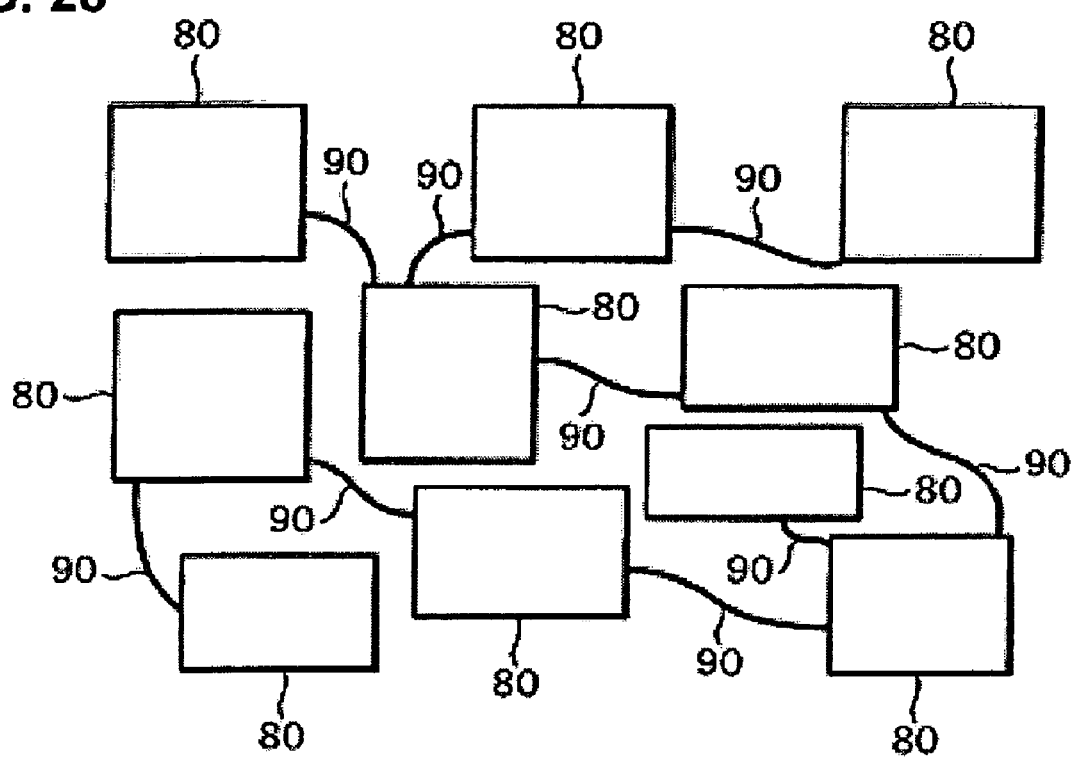
[FIG. 28] is a diagram schematically showing a usage configuration of optical transmission devices in accordance with a sixth embodiment of the present invention.

FIG. 28 is a diagram showing a usage configuration of optical transmission devices in accordance with a sixth embodiment of the present invention. Optical transmission devices 90 connect electronic devices 80. The electronic devices 80 include, for example, liquid crystal display monitors, digital CRTs (which may be used in the fields of finance, mail order, medical treatment, and education), liquid crystal projectors, plasma display panels (PDP), digital TVs, cash registers of retail stores (for POS (Point of Sale Scanning), videos, tuners, gaming devices, printers and the like.

The embodiments of the present invention are described in detail above. However, it is readily understood by those skilled in the art that many modifications can be made without substantially departing from the novel matter and effects of the present invention. Accordingly, all of such modification examples are included in the scope of the present invention.

For example, in the surface-emitting lasers of the embodiments described above, descriptions are made as to the case where a single columnar section 130 is provided in a resonator 140. However, the embodiments of the present invention are not ruined even when multiple columnar sections 130 are provided in a resonator 140, or no columnar section 130 is provided therein. Also, even when plural surface-emitting lasers are formed in an array, actions and effects similar to the above are achieved.

Also, for example, interchanging the p-type and n-type characteristics of each of the semiconductor layers in the above described embodiments does not deviate from the subject matter of the present invention. Also, in the surface-emitting lasers of the embodiments described above, the description is made as to an AlGaAs type, but depending on the oscillation wavelength, other materials, such as, for example, InP type, AlGaP type, GaInP type, ZnSSe type, InGaN type, AlGaN type, InGaAs type, GaInNAs type, GaAsSb type, and like semiconductor materials can be used.

What is claimed is:

1. A surface-emitting type semiconductor laser comprising:
   a substrate;
   a first mirror formed above the substrate;
   an active layer formed above the first mirror;
   a second mirror formed above the active layer;
   an electrode formed above the second mirror; and
   a lens section formed above the second mirror,
   the electrode having an opening section,
   a circumference of the lens section being match up a circumference of the opening section,
   the lens section having a function to change a path of light that is emitted from an upper surface of the second mirror,
   at least one of the first mirror, the active layer and the second mirror having a photonic crystal region having a refractive index distribution that is periodic in a plane direction,
   the photonic crystal region having a defect region and having a function to confine light in the defect region, the defect region having no holes formed therein,
   a plurality of holes, exposed to a surface upon which the lens is formed and extending in a thickness direction perpendicular to the plane direction, being formed in the photonic crystal region, and
   a material within the plurality of holes and a material of the lens being independent from each other.

2. A surface-emitting type semiconductor laser according to claim 1,
   a center of the defect region in a plan view concurring or generally concurring with a center of light emitted from the upper surface of the second mirror, and the plurality of holes being arranged at positions rotationally symmetric with respect to the center of the defect region.

3. A surface-emitting type semiconductor laser according to claim 1, the holes being filled with a dielectric material.

4. A surface-emitting type semiconductor laser according to claim 1, the lens section being formed at least above the defect region.

5. A surface-emitting type semiconductor laser according to claim 1, the lens section being damned out by the electrode.

6. An optical module comprising the surface-emitting type semiconductor laser according to claim 1 and an optical waveguide.

7. A light transmission device comprising the optical module according to claim 6.

8. A surface-emitting type semiconductor laser according to claim 1, the second mirror having an oxidized constricting layer, an opening region of the oxidized constricting layer being smaller than the photonic crystal region.

9. A surface-emitting type semiconductor laser according to claim 1, the second mirror having an oxidized constricting layer, an opening region of the oxidized constricting layer being larger than the defect region.

10. A surface-emitting type semiconductor laser according to claim 1, the holes being formed only in a part of the second semiconductor layer.

11. A surface-emitting type semiconductor laser according to claim 1, the holes being extended in the thickness direction from the second mirror to part of a first semiconductor layer.

12. A surface-emitting type semiconductor laser according to claim 1, the holes being formed only in a part of the first semiconductor layer.

13. A surface-emitting type semiconductor laser according to claim 1, a region formed lens being smaller than the photonic crystal region.

* * * * *